(12) United States Patent
Chen

(10) Patent No.: US 12,205,970 B2
(45) Date of Patent: Jan. 21, 2025

(54) IMAGE SENSOR PIXEL WITH DEEP TRENCH ISOLATION STRUCTURE

(71) Applicant: MAGVISION SEMICONDUCTOR (BEIJING) INC., Beijing (CN)

(72) Inventor: Gang Chen, San Jose, CA (US)

(73) Assignee: MAGVISION SEMICONDUCTOR (BEIJING) INC., Beijing (CN)

( * ) Notice: Subject to any disclaimer, the term of this patent is extended or adjusted under 35 U.S.C. 154(b) by 452 days.

(21) Appl. No.: 17/476,989

(22) Filed: Sep. 16, 2021

(65) Prior Publication Data

US 2023/0082312 A1 Mar. 16, 2023

(51) Int. Cl.
*H01L 27/146* (2006.01)

(52) U.S. Cl.
CPC .... *H01L 27/1463* (2013.01); *H01L 27/14623* (2013.01); *H01L 27/1464* (2013.01); *H01L 27/14685* (2013.01)

(58) Field of Classification Search
CPC .......... H01L 27/1463; H01L 27/14623; H01L 27/1464; H01L 27/14685
See application file for complete search history.

(56) References Cited

U.S. PATENT DOCUMENTS

| | | | | |
|---|---|---|---|---|
| 5,536,675 A * | 7/1996 | Bohr | ................. | H01L 21/76229 257/E21.548 |
| 5,895,253 A * | 4/1999 | Akram | .............. | H01L 21/76232 257/E21.549 |
| 6,214,696 B1 * | 4/2001 | Wu | ................... | H01L 21/76232 257/E21.549 |
| 6,380,095 B1 * | 4/2002 | Liu | ...................... | H01L 21/3065 438/719 |
| 7,214,999 B2 * | 5/2007 | Holm | ................ | H01L 27/14687 257/292 |
| 7,838,956 B2 * | 11/2010 | McCarten | ........... | H01L 27/1464 257/447 |

(Continued)

FOREIGN PATENT DOCUMENTS

| | | |
|---|---|---|
| CN | 102244004 A | 11/2011 |
| CN | 105489621 A | 4/2016 |

(Continued)

*Primary Examiner* — Mounir S Amer
*Assistant Examiner* — Alexander Belousov
(74) *Attorney, Agent, or Firm* — HAYNES AND BOONE, LLP

(57) ABSTRACT

An image sensor device is disclosed. The image sensor device includes a substrate having a plurality of pixel regions. Two adjacent pixel regions are optically and electrically isolated by a deep trench isolation structure. In an embodiment, a method of forming the deep trench isolation structure includes receiving a workpiece comprising a first isolation structure formed in a front side of a substrate, forming a trench extending through the first isolation structure and the substrate, forming a dielectric liner to line the trench, depositing a conductive layer conformally over the workpiece after the forming of the dielectric liner, and depositing a dielectric fill layer over the conductive layer to fill the trench. A refractive index of the dielectric fill layer may be smaller than a refractive index of the conductive layer. The present disclosure also includes an alternative method for forming isolation structures at a back side of the substrate.

20 Claims, 22 Drawing Sheets

(56) References Cited

U.S. PATENT DOCUMENTS

| | | | | |
|---|---|---|---|---|
| 7,847,361 B2* | 12/2010 | Kokusenya | ....... | H01L 31/02164 257/E31.127 |
| 9,685,475 B2* | 6/2017 | Guyader | ............. | H01L 27/1463 |
| 9,711,555 B2* | 7/2017 | Liu | .................. | H01L 27/14618 |
| 9,923,009 B1* | 3/2018 | Hsiung | ............. | H01L 27/14685 |
| 10,304,886 B2* | 5/2019 | Chiang | ............... | H01L 27/1464 |
| 10,432,883 B1* | 10/2019 | Chapman | ......... | H01L 27/14641 |
| 10,825,853 B2* | 11/2020 | Chiang | ............... | H01L 27/1463 |
| 11,101,168 B2* | 8/2021 | Shih | ........................ | H01L 21/84 |
| 11,152,415 B2* | 10/2021 | Lim | ................. | H01L 27/14636 |
| 11,201,124 B2* | 12/2021 | Liu | ....................... | H01L 23/585 |
| 11,430,823 B2* | 8/2022 | Chiang | ............... | H01L 27/14689 |
| 11,594,597 B2* | 2/2023 | Cheng | ............... | H01L 21/76286 |
| 11,670,662 B2* | 6/2023 | Lee | ..................... | H01L 27/1463 257/72 |
| 11,830,765 B2* | 11/2023 | Shih | ................... | H01L 23/5226 |
| 11,901,387 B2* | 2/2024 | Kao | .................... | H01L 27/14683 |
| 2006/0158547 A1* | 7/2006 | Komatsu | .......... | H01L 27/14621 348/340 |
| 2006/0186547 A1* | 8/2006 | Wang | ................ | H01L 27/14623 257/758 |
| 2006/0276001 A1* | 12/2006 | Ogawa | ................ | H01L 29/7834 257/E29.267 |
| 2007/0102572 A1 | 5/2007 | Yokozawa | | |
| 2007/0102716 A1* | 5/2007 | Kim | .................. | H01L 27/14632 257/89 |
| 2007/0103572 A1 | 5/2007 | Yokozawa | | |
| 2007/0284685 A1* | 12/2007 | Tanaka | ................ | H01L 27/1464 257/E31.127 |
| 2010/0148289 A1* | 6/2010 | McCarten | ......... | H01L 27/14656 257/E31.127 |
| 2011/0181749 A1* | 7/2011 | Yamada | ............ | H01L 27/14638 257/E31.073 |
| 2011/0281416 A1* | 11/2011 | Hashimoto | ....... | H01L 21/76232 257/E21.546 |
| 2014/0291481 A1* | 10/2014 | Zhang | ................ | H01L 27/1463 257/431 |
| 2016/0043132 A1* | 2/2016 | Ihara | ................... | H01L 27/1463 257/291 |
| 2016/0099278 A1* | 4/2016 | Guyader | ............. | H01L 27/1203 257/432 |
| 2017/0365631 A1* | 12/2017 | Iizuka | ............... | H01L 27/14687 |
| 2020/0127025 A1* | 4/2020 | Lim | ....................... | H04N 25/79 |
| 2020/0203478 A1* | 6/2020 | Shank | ............... | H01L 21/76237 |
| 2021/0126089 A1* | 4/2021 | Cheng | ................ | H01L 27/1203 |
| 2021/0134655 A1* | 5/2021 | Shih | .................. | H01L 21/76802 |
| 2021/0175380 A1 | 6/2021 | Borthakur et al. | | |
| 2021/0313477 A1* | 10/2021 | Kusukawa | ........ | H01L 27/14698 |
| 2021/0358800 A1* | 11/2021 | Shih | ....................... | H01L 21/84 |
| 2022/0199658 A1* | 6/2022 | Lee | ..................... | H01L 27/1463 |
| 2022/0230909 A1* | 7/2022 | Li | ..................... | H01L 21/76205 |
| 2022/0278144 A1* | 9/2022 | Kao | .................... | H01L 27/1463 |
| 2022/0344384 A1* | 10/2022 | Jung | ................. | H01L 27/14627 |
| 2022/0352308 A1* | 11/2022 | Cheng | ............... | H01L 21/76286 |
| 2022/0384496 A1* | 12/2022 | Cheng | ............... | H01L 27/14634 |
| 2023/0082312 A1* | 3/2023 | Chen | ................. | H01L 27/14623 257/432 |
| 2023/0089511 A1* | 3/2023 | Chen | ................. | H01L 27/14636 257/432 |
| 2023/0131599 A1* | 4/2023 | Chen | ................. | H01L 27/14612 257/432 |
| 2023/0253429 A1* | 8/2023 | Lee | ..................... | H01L 27/1462 257/72 |
| 2023/0369367 A1* | 11/2023 | Cheng | ............... | H01L 27/14627 |
| 2023/0377950 A1* | 11/2023 | Shih | .................. | H01L 29/66772 |

FOREIGN PATENT DOCUMENTS

| | | |
|---|---|---|
| CN | 107564926 A | 1/2018 |
| CN | 108615739 A | 10/2018 |
| CN | 110416152 A | 11/2019 |
| CN | 110600490 A | 12/2019 |
| CN | 111081725 A | 4/2020 |
| CN | 113113433 A | 7/2021 |

* cited by examiner

IMAGE SENSOR PIXEL WITH DEEP TRENCH ISOLATION STRUCTURE

BACKGROUND

The applications of image sensors have become ubiquitous. An image sensor may include an array of pixels arranged in two dimensions. Each of the pixels includes a photodiode, or other suitable photoelectric elements. A micro-lens (or microlens) may be formed over the photodiode. The micro-lens focuses light onto the photodiode, and the photodiode converts the light into electric signals. The electric signals are output from the image sensor to other components of a host electronic device, such as a digital camera, a mobile phone, a computer, a security camera, an automotive product, a medical accessory, or other electronic device, to form an image.

The semiconductor integrated circuit (IC) industry has experienced exponential growth. Technological advances in IC materials and design have produced generations of ICs where each generation has smaller and more complex circuits than the previous generation. The technologies used to manufacture image sensors, such as complementary metal oxide semiconductor (CMOS) image sensor technology, have continued to advance as well. The demands for higher resolution and lower power consumption have driven the trend of further miniaturization and integration of image sensors. The corresponding pixels in image sensors are therefore scaled down. This scaling down process generally provides benefits by increasing production efficiency and lowering associated costs. Such scaling down has also increased the complexity of processing and manufacturing. For example, as the sizes of pixels continue to decrease, optical cross talk and interference among pixels may occur more often. Deep trench isolation (DTI) structures have been proposed to isolate pixels one from another. Although existing DTI structures have been generally adequate for their intended purposes, they are not satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
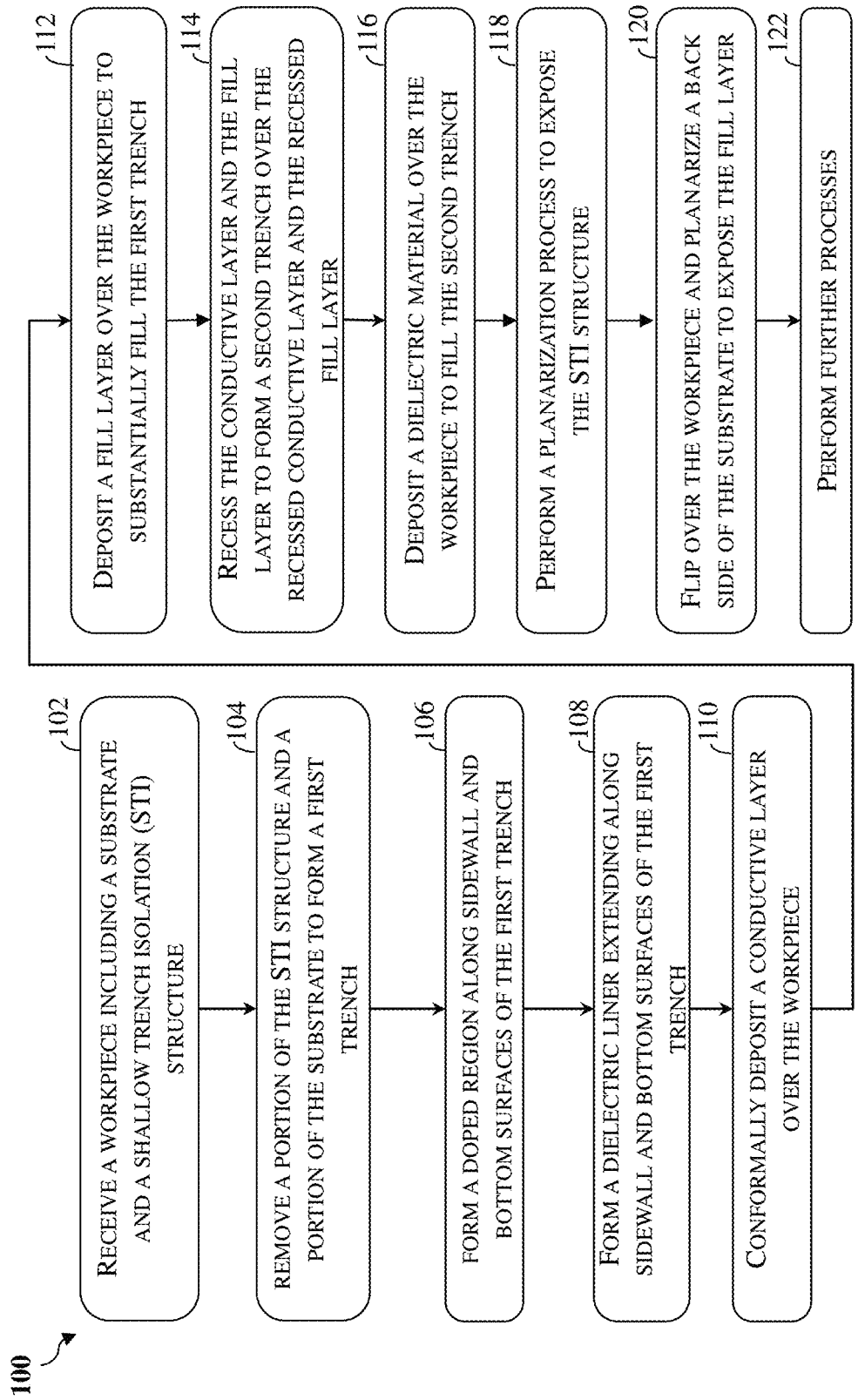
FIG. 1 illustrates a flowchart of an exemplary method for fabricating a semiconductor device having a deep trench isolation (DTI) structure, according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Deep trench isolation (DTI) structures, such as BDTI (back-side DTI) structures and FDTI (front-side DTI or referred to as full-depth DTI) structures, have been picked as a promising approach for isolating pixels of CMOS image sensors. Generally, a DTI structure defines cells with unit size. Each cell provides a pixel region to allocate components of a pixel. However, along the aggressive pace of down scaling, optical cross talk between two adjacent pixels becomes more and more serious.

The present disclosure is generally related to image sensors. More particularly, some embodiments are related to complementary metal oxide semiconductor (CMOS) image sensors with a deep trench isolation (DTI) structure defining an array of pixel regions for components of pixels to reside therein. In an embodiment, the DTI structure is a hybrid structure extending through a substrate and includes an upper portion and a lower portion, which includes a first layer sandwiched by a second layer. The first layer is spaced apart from the substrate by the second layer. A refractive index of the first layer may be smaller than a refractive index of the second layer such that at least a portion of an incident light may be reflected to the corresponding pixel. The second layer may be a conductive layer such that a bias voltage may be applied to the DTI structure to induce carrier accumulation and thus reduce dark current. In some embodiments, the second layer is spaced apart form the substrate by a dielectric layer. By forming the hybrid DTI structure, neighboring pixels may be electrically and optically isolated, the quantum efficiency may be increased, and optical cross talk may be reduced.

The various aspects of the present disclosure will now be described in more detail with reference to the figures. In that regard, FIG. 1 is a flowchart illustrating method 100 of forming a semiconductor device with a front-side deep trench isolation (FDTI) structure according to embodiments of the present disclosure. Method 100 is described below in conjunction with FIGS. 2-14, which are fragmentary cross-sectional views of a workpiece 200 at different fabrication stages according to embodiments of method 100. FIG. 15 includes a flowchart illustrating an alternative method 300 of forming a semiconductor device with a back-side deep trench isolation (BDTI) structure, according to embodiments of the present disclosure. Method 300 is described below in conjunction with FIGS. 16-22, which are fragmentary cross-sectional views of a workpiece 400 at different fabrication stages according to embodiments of method 300. Methods 100 and 300 are merely examples and are not intended to limit the present disclosure to what is explicitly illustrated therein. Additional steps may be provided before, during and after the method 100 and/or method 300, and some steps described can be replaced, eliminated, or moved around for additional embodiments of the method. Not all steps are described herein in detail for reasons of simplicity. Because the workpiece 200/400 will be fabricated into a semiconductor device 200/400 or an image sensor 200/400 upon conclusion of the fabrication processes, the workpiece 200/400 may be referred to as the semiconductor device 200/400 or image sensor 200/400 as the context requires. The method 100 and method 300 may be used to form deep trench isolation structures in stacked silicon CMOS image sensors, non-stack image sensors, and other suitable structures. For avoidance of doubts, the X, Y and Z directions in the figures are perpendicular to one another and are used consistently. Throughout the present disclosure, like reference numerals denote like features unless otherwise excepted.

Figure 2:
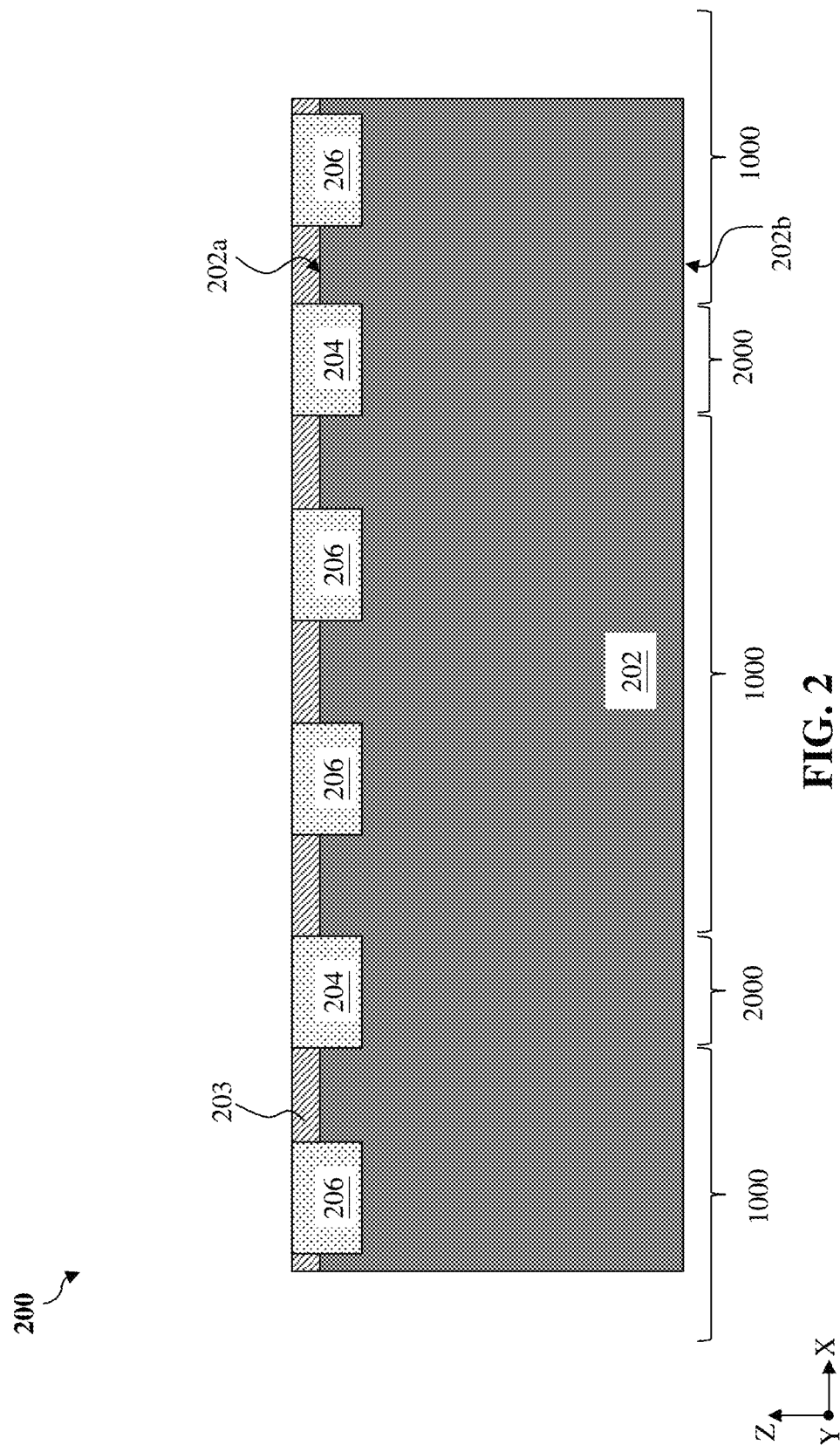
FIGS. 2, 3, 4, 5, 6, 7, 8, 9, 10, 11, 12, 13, and 14 illustrate fragmentary cross-sectional views of a workpiece during various fabrication stages in the method of FIG. 1, according to various aspects of the disclosure.

Referring to FIGS. 1 and 2, method 100 includes a block 102 where a workpiece 200 is received. The workpiece 200 includes a first substrate 202. In an embodiment, the first substrate 202 is a bulk silicon substrate (i.e., including bulk single-crystalline silicon). The first substrate 202 may include other semiconductor materials in various embodiment, such as germanium, silicon carbide, gallium arsenide, gallium phosphide, indium phosphide, indium arsenide, indium antimonide, SiGe, GaAsP, AllnAs, AlGaAs, GaInAs, GaInP, GaInAsP, or combinations thereof. In some alternative embodiments, the first substrate 202 may be a semiconductor-on-insulator substrate, such as a silicon-on-insulator (SOI) substrate, a silicon germanium-on-insulator (SGOI) substrate, or a germanium-on-insulator (GOI) substrate, and includes a carrier, an insulator on the carrier, and a semiconductor layer on the insulator. The first substrate 202 includes a first surface 202a and a second surface 202b facing each other. In embodiments represented in FIG. 2, the first surface 202a is the top surface or the front-side surface of the first substrate 202, and the second surface 202b is the bottom surface or the back-side surface of the first substrate 202. The workpiece 200 includes a number of pixel regions 1000 for forming pixels and a numbers of isolation regions 2000 for forming isolation structures. Upon conclusion of the fabrication process in method 100, isolation structures (e.g., isolation structure 240 shown in FIG. 13) formed in the isolation regions 2000 would isolate two adjacent pixel regions 1000. The isolation regions 2000 may be disposed at the edges of each of the pixel regions 1000, such that each of the pixel regions 1000 may be defined as a closed space surrounded by walls of the to-be-formed isolation structures (e.g., isolation structure 240 shown in FIG. 13) from a top view.

The workpiece 200 includes a number of first isolation structures 204 formed in the front side of the isolation regions 2000. In embodiments represented in FIG. 2, the workpiece 200 also includes one or more second isolation structures 206 formed in each of the pixel regions 1000 to isolate two adjacent components (e.g., transistor and photodiode) in the same pixel region 1000. It is noted that, in embodiments where a pixel includes a continuous active region, the workpiece 200 may not include the second isolation structures 206 in that pixel region 1000. The first isolation structure 204 and the second isolation structure 206 may also be referred to as a first shallow trench isolation (STI) structure 204 and a second STI structure 206, respectively. In some embodiments, the first STI structures 204 and the second STI structures 206 may include silicon oxide, silicon oxynitride, fluorine-doped silicate glass (FSG), a low-k dielectric, combinations thereof, and/or other suitable materials. The first STI structures 204 and the second STI structures 206 may be formed simultaneously or sequentially in any order.

In an embodiment, the formation of the first STI structures 204 and the second STI structures 206 includes forming a protective layer 203 on the first surface 202a of the first substrate 202, performing a patterning process to the protective layer 203 to form a number of openings exposing portions of the first substrate 202, removing the portions of the first substrate 202 exposed by the openings to form a number of trenches, forming one or more dielectric layers over the first substrate 202 to fill the trenches, and performing a planarization process (e.g., a chemical mechanical polishing CMP) to remove excess materials on the protective layer 203 to form the first STI structures 204 and the second STI structures 206. In some embodiments, the planarization process may stop when it reaches the top surface of the protective layer 203, which is used to protect the first substrate 202 during the planarization process. The patterning process applied to the protective layer 203 may include multiple processes. For example, a photoresist layer (not shown) may be formed over the protective layer 203, exposed to a radiation source using a photo mask, and subsequently developed to form a patterned photoresist layer. The protective layer 203 may then be etched using the patterned photoresist layer as an etch mask to form the number of openings. The protective layer 203 may include silicon nitride, silicon carbonitride, silicon oxycarbide, silicon oxynitride, silicon oxycarbonitride, other suitable materials, or combinations thereof, and may be formed by chemical vapor deposition (CVD), physical vapor deposition (PVD), other suitable methods, or combinations thereof.

Figure 3:
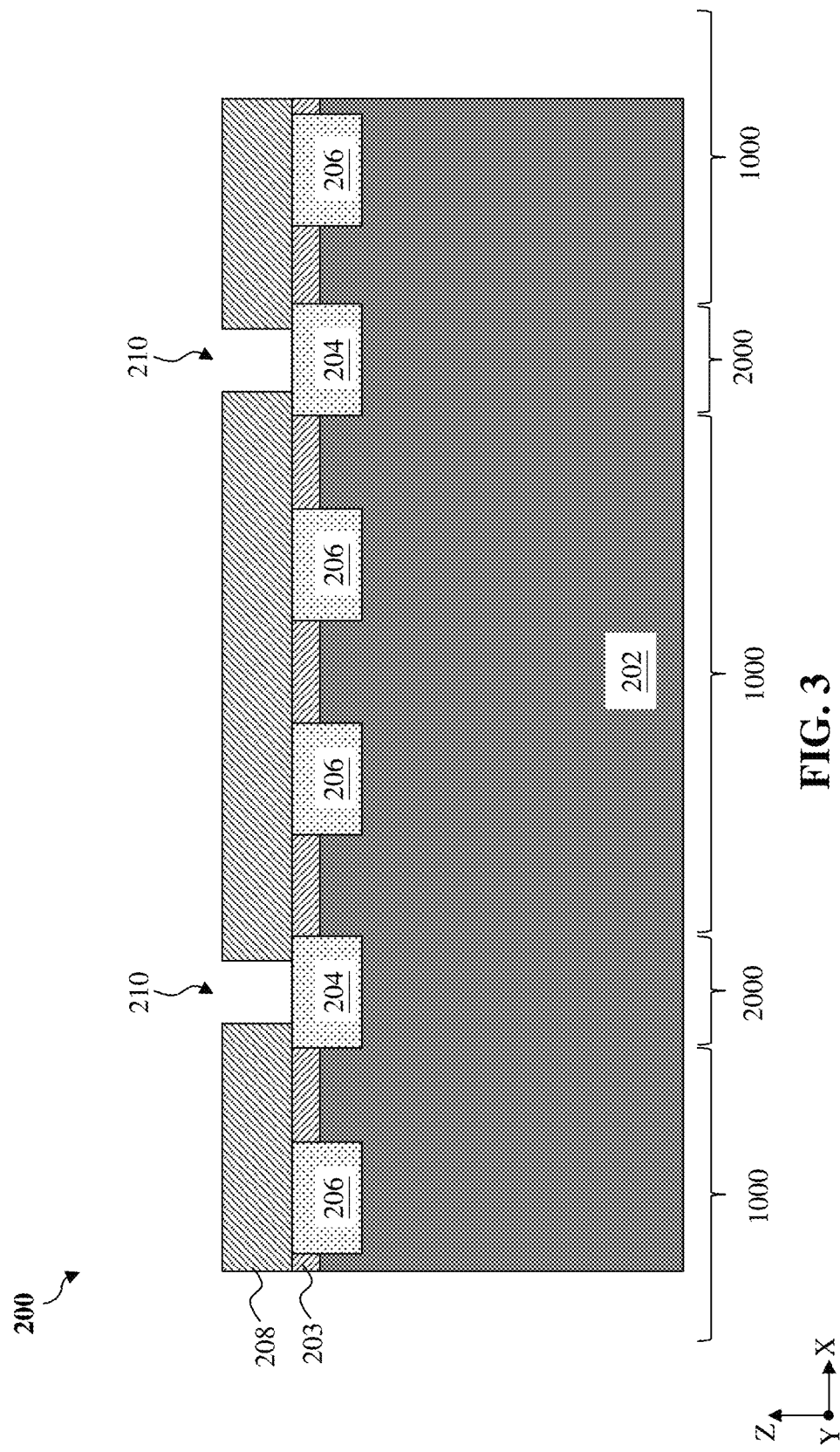
Figure 4:
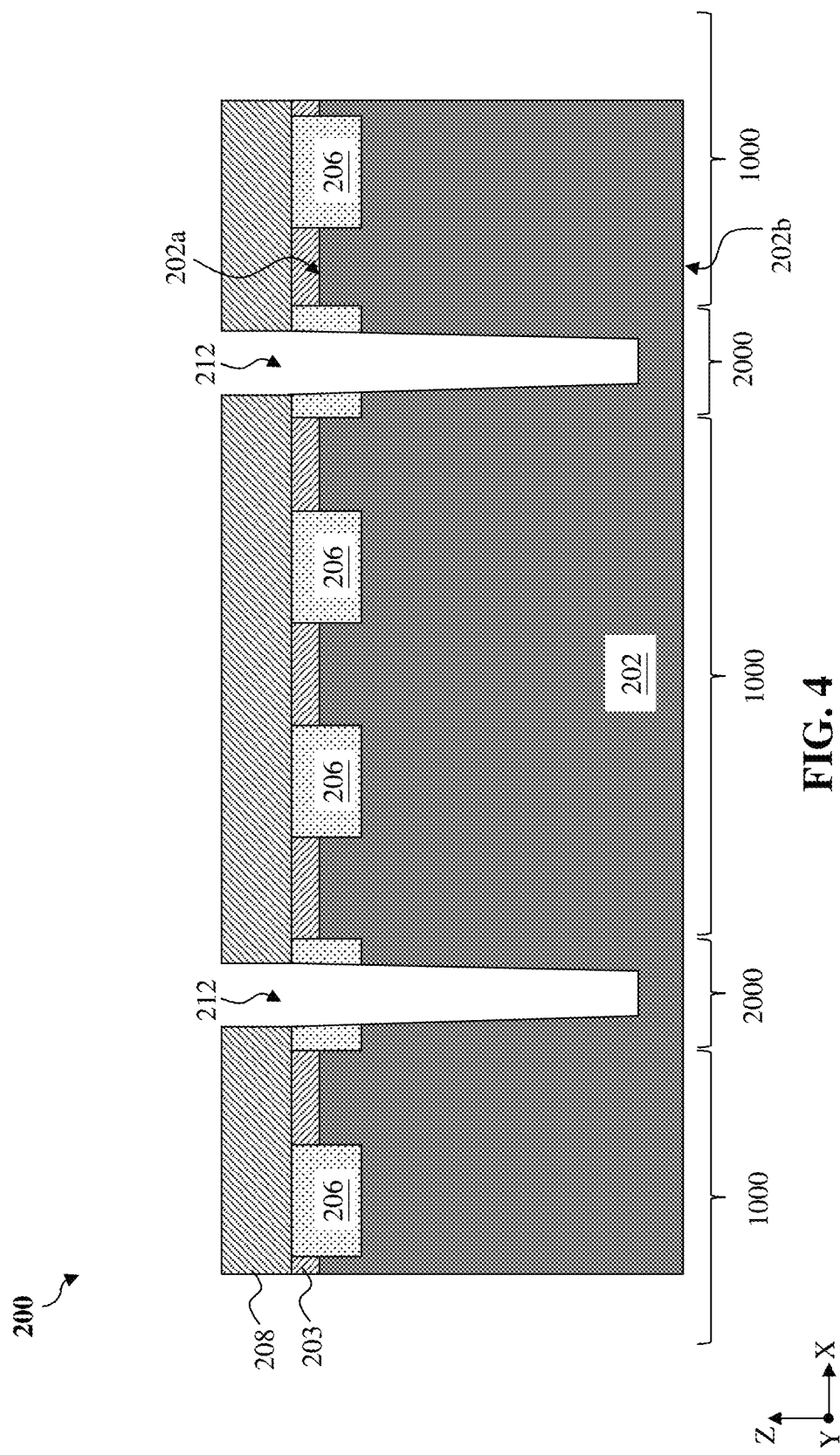
Figure 9:
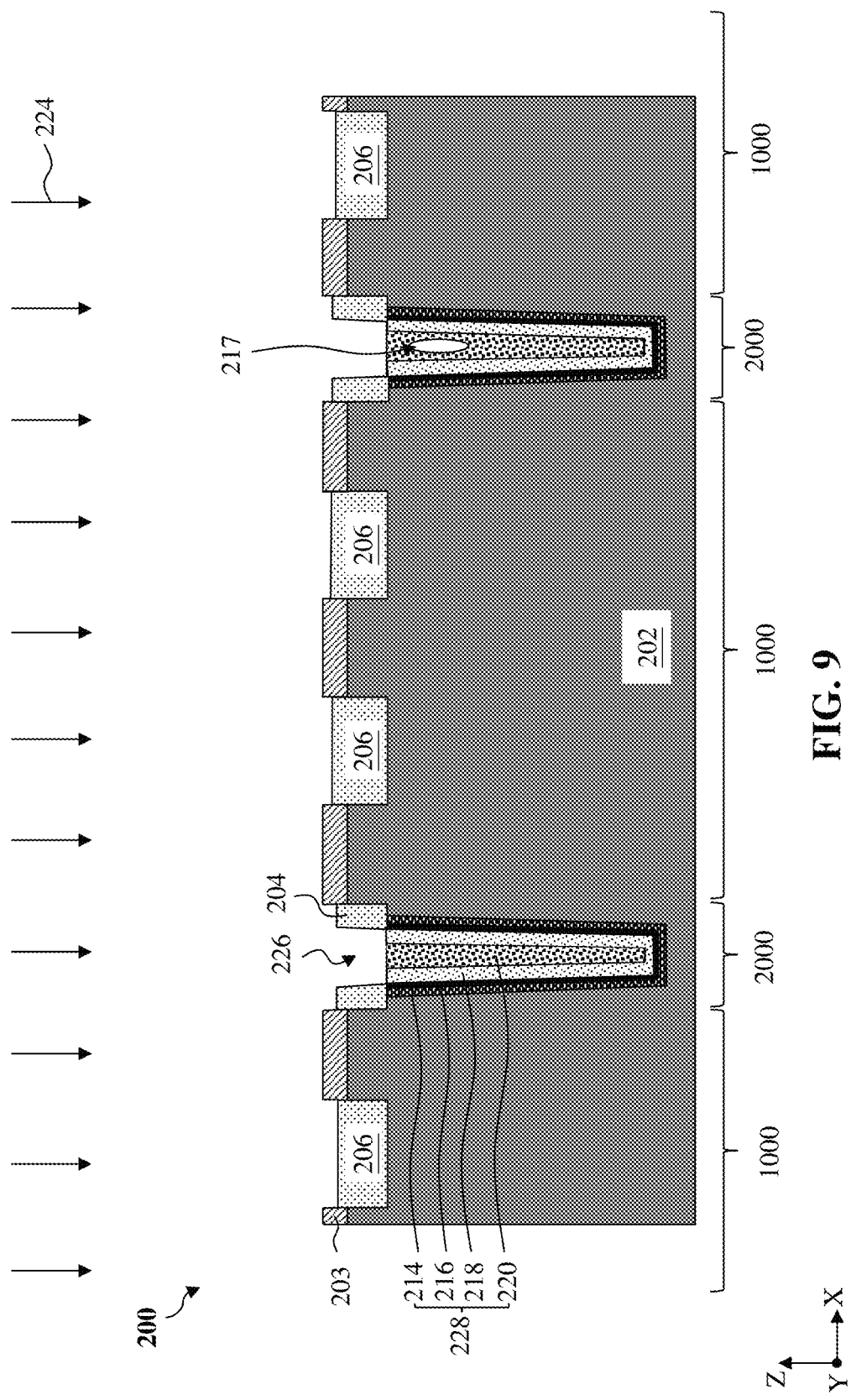

Referring to FIGS. 1 and 3-4, method 100 includes a block 104 where a portion of the first STI structure 204 and a portion of the first substrate 202 directly under the first STI structure 204 are removed to form a first trench 212. As shown in FIG. 3, the formation of the first trench 212 includes forming a patterned hard mask layer 208 over the workpiece 200. The patterned hard mask layer 208 includes an opening 210 exposing a portion of the first STI structure 204. In embodiments represented in FIG. 3, the opening 210 spans a width smaller than a width of the first STI structure 204 along the X direction. In some other embodiments, instead of using the patterned hard mask layer 208, other suitable mask films may be used to facilitate the formation of the first trench 212. Now referring to FIG. 4, an etching process is performed to extend the opening 210 vertically downward to form the first trench 212 while using the patterned hard mask layer 208 as an etch mask. More specifically, the etching process removes the portion of the first STI structure 204 exposed by the opening 210 and a portion of the first substrate 202 directly under that portion of the first STI structure 204 to form the first trench 212. In embodiments represented in FIG. 4, the first trench 212 extends through the first STI structure 204. Further, the first trench 212 extends substantially through the first substrate 202 but does not reach the second surface 202b of the first substrate 202. The first trench 212 may be a tapered trench as shown in FIG. 4 or may be a trench having a substantially vertical sidewall. The etching process may be a dry etching process, a wet etching process, or a combination thereof that implements a suitable etchant. In an embodiment, the patterned hard mask layer 208 is selectively removed after forming the first trench 212. In another embodiment, instead of removing the patterned hard mask layer 208 immediately after forming the first trench 212, the patterned hard mask layer 208 may be removed by a subsequent etching process 224 (FIG. 9).

Figure 5:
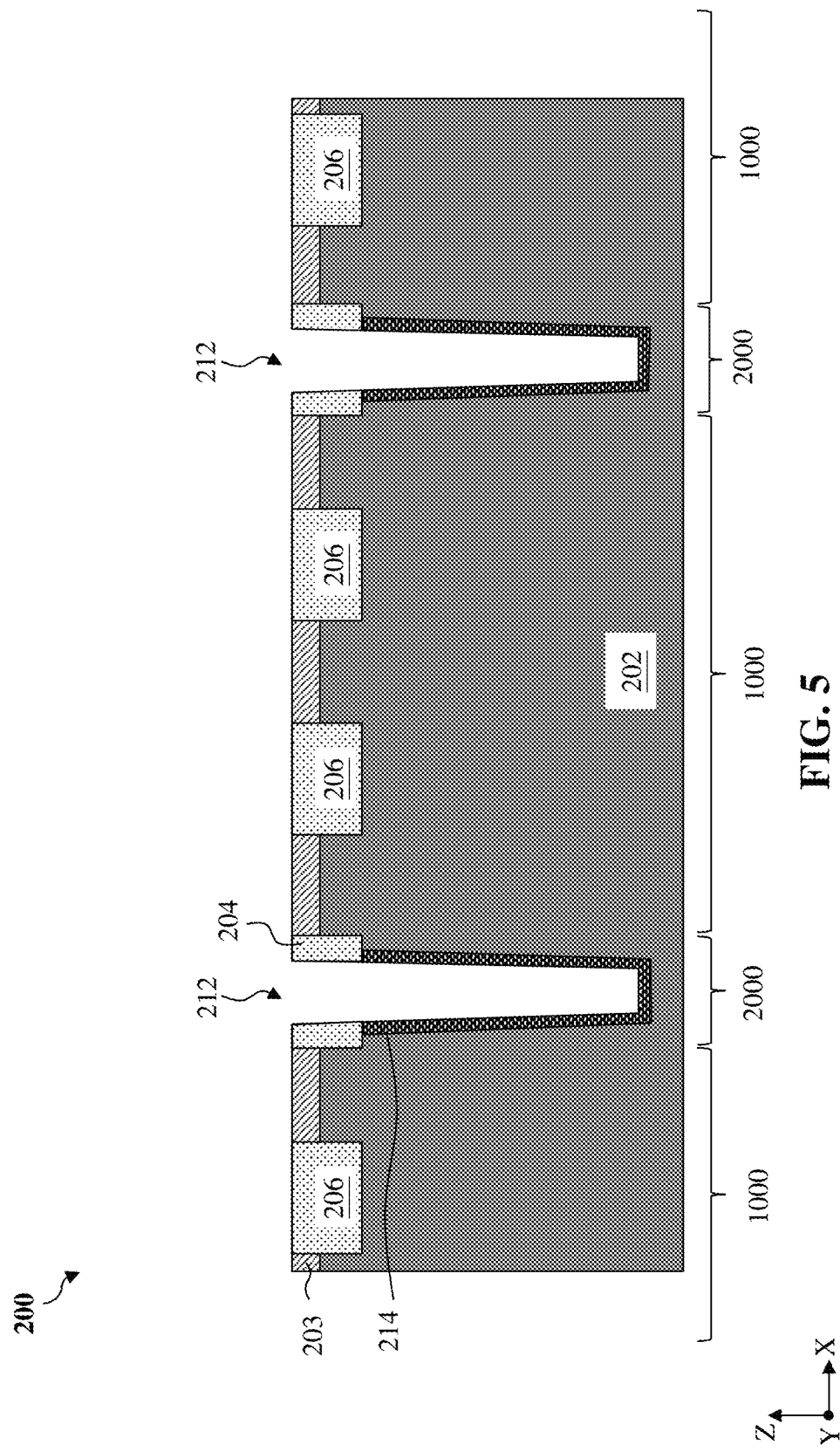

Referring to FIGS. 1 and 5 (FIG. 5 shows the embodiment where the patterned hard mask layer 208 is removed after the first trench 212 is formed), method 100 includes a block 106 where a doped region 214 is formed along the sidewall and bottom surfaces of the first trench 212. A plasma doping process (e.g., plasma immersion ion implantation) may be performed to form the doped region 214. The plasma doping process implants portions of the first substrate 202 through the sidewall and bottom surfaces of the first trench 212 with one or more ion species. A doping polarity of the doped region 214 is the same as a doping polarity of the first substrate 202, but with a higher dopant concentration than the first substrate 202. That is, the doping polarity of the doped region 214 is opposite to a doping polarity of a photosensitive device that will be formed in the first substrate 202. In embodiments where the first substrate 202 is a p-type substrate, the to-be-formed photosensitive device (not shown) includes an n-type region formed in the p-type substrate 202, the doped region 214 is a p-type doped region (doped by boron, for example) such that holes would accumulate at the sidewall of the first trench 212, thereby isolating the dangling bonds and/or defects at the interface between the first substrate 202 and the first trench 212 and reducing dark current and white pixels. In embodiments where the first substrate 202 is an n-type substrate and the to-be-formed photosensitive device (not shown) includes a p-type region formed in the n-type substrate 202, the doped region 214 is an n-type doped region 214, the plasma implant species may include, for example, phosphorus, and electrons would accumulate at the sidewall of the first trench 212.

Figure 6:
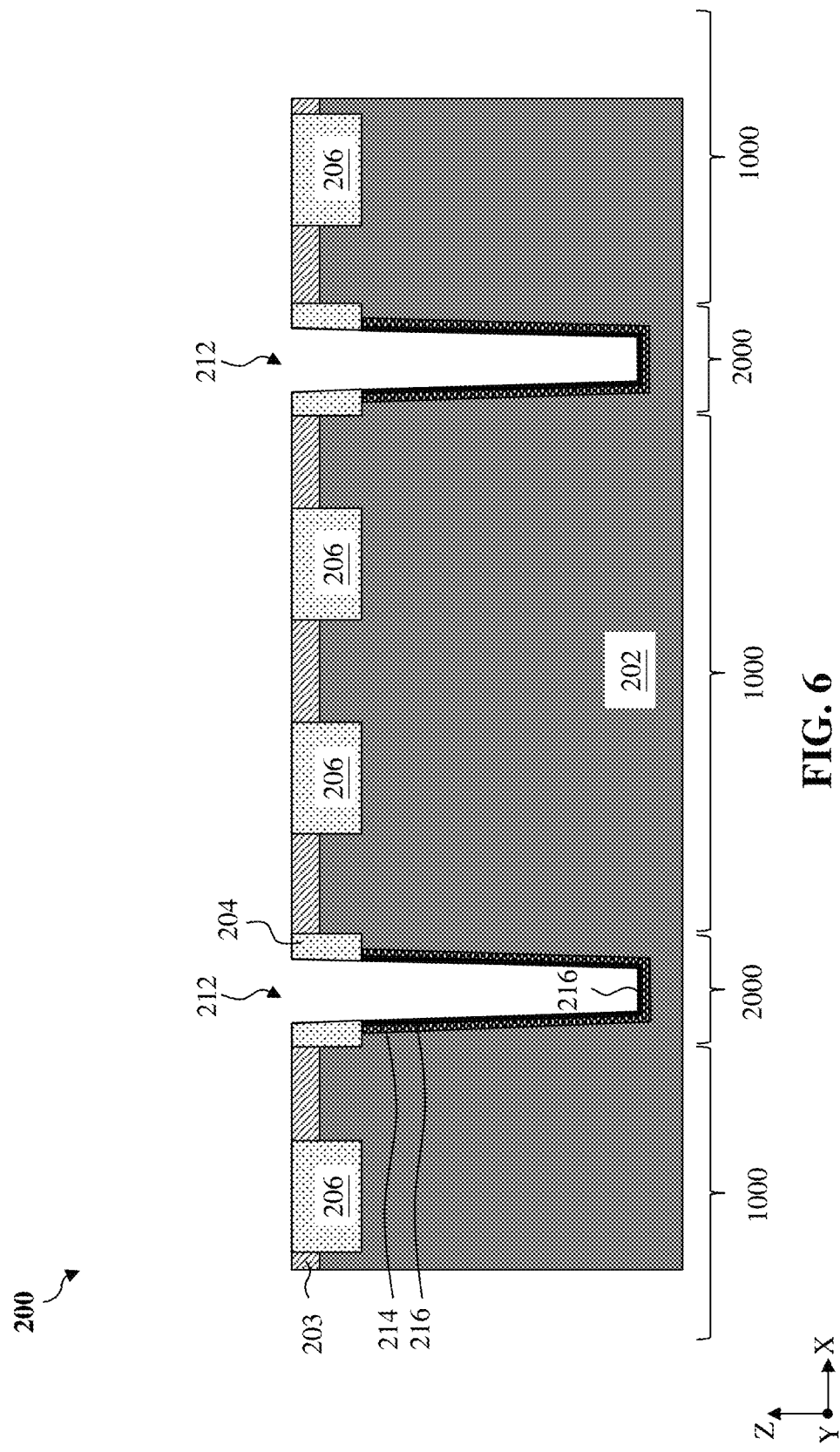

Referring to FIGS. 1 and 6, method 100 includes a block 108 where a dielectric liner 216 is formed in the first trench 212 to electrically isolate a to-be-formed conductive layer 218 from the first substrate 202. In some embodiments, the dielectric liner 216 may include silicon oxide, silicon nitride, silicon oxycarbonitride, silicon carbonitride, silicon oxynitride, other suitable materials, or combinations thereof. The dielectric liner 216 may be formed using a suitable method, such as atomic layer deposition (ALD), chemical vapor deposition (CVD), thermal oxidation, or other suitable methods. In embodiments represented in FIG. 6, the dielectric liner 216 is formed by thermal oxidation and is thus only formed on surfaces of the first substrate 202 exposed by the first trench 212. That is, the dielectric liner 216 does not extend along sidewall surfaces of the first STI structure 204 exposed by the first trench 212. In embodiments where the first substrate 202 includes silicon, the dielectric liner 216 includes silicon oxide. The dielectric liner 216 partially fills the first trench 212. In embodiments where the dielectric liner 216 is formed by a deposition process, the dielectric liner 216 may be formed over the workpiece 200, including over the sidewall and bottom surfaces of the first trench 212, and top surfaces of the first STI structures 204, the second STI structures 206, and the protective layer 203.

Figure 7:
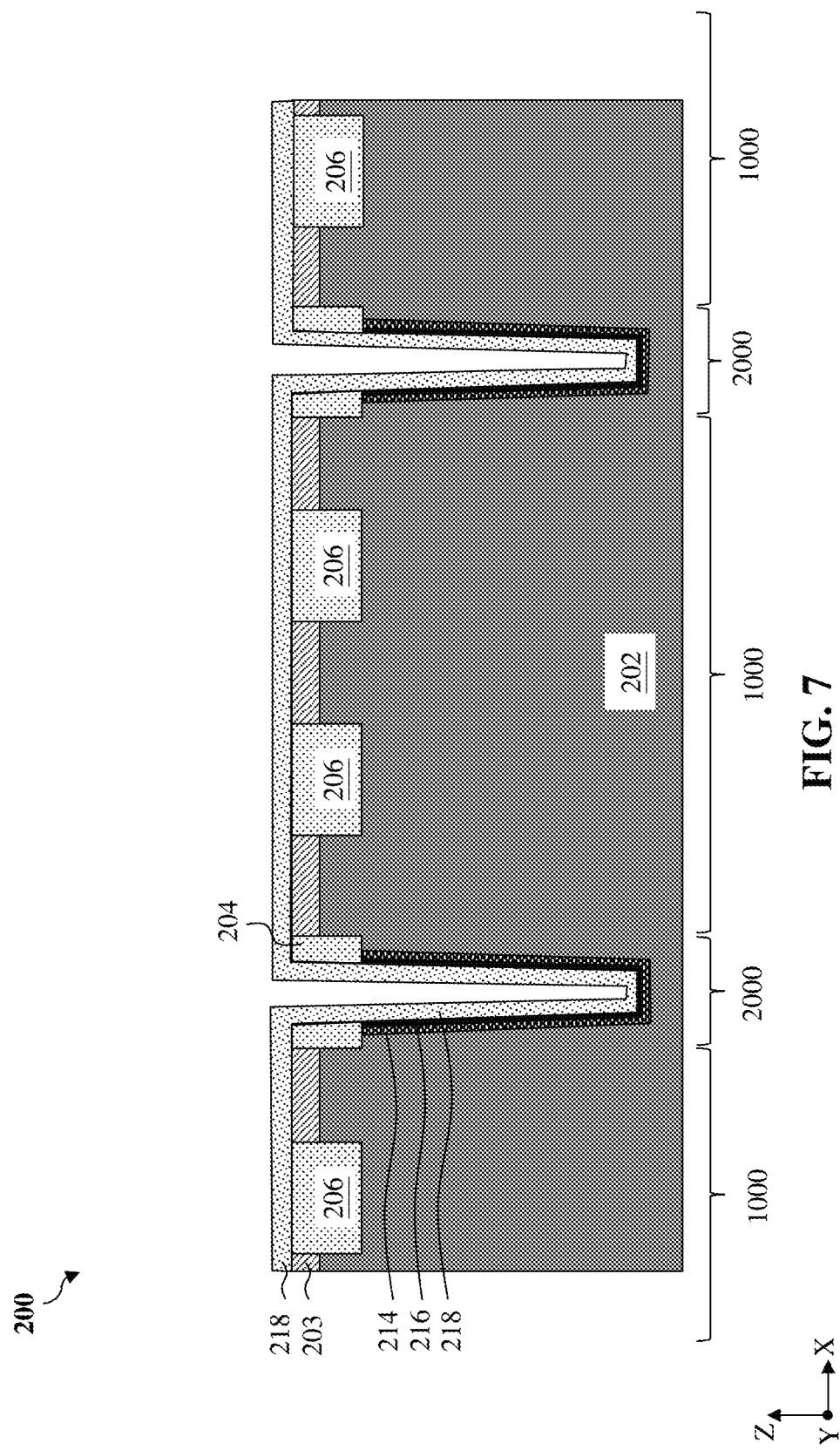

Referring to FIGS. 1 and 7, method 100 includes a block 110 where a conductive layer 218 is conformally formed over the workpiece 200, including over top surfaces of the protective layer 203, the second STI structures 206 and the first STI structures 204, and sidewalls of the first STI structures 204 and the dielectric liner 216, to partially fill the first trench 212. The term "conformally" may be used herein for ease of description of a layer having a substantially uniform thickness over various regions. In some embodiments, the conductive layer 218 may include doped polycrystalline silicon, titanium nitride, aluminum, tungsten, other suitable materials, or combinations thereof and may be deposited using processes such as CVD, ALD, or other suitable processes. In an embodiment, the conductive layer 218 includes doped polycrystalline silicon, and a doping polarity of the conductive layer 218 is the same as the doping polarity of the doped region 214. For example, when the first substrate 202 is a p-type substrate and the doped region 214 is a p-type region, the conductive layer 218 may be a p-type doped polycrystalline silicon. Polycrystalline silicon may absorb incident light, leading to a reduced quantum efficiency. In embodiments where the pixels and the DTI structures have small dimensions to achieve a desired density, a deposition thickness of the polycrystalline silicon would be too small that the incident light may penetrate through the polycrystalline silicon and enter into neighboring pixels, leading to optical cross talk. To improve the optical performance of the DTI structure while ensuring the electrical performance provided by the conductive layer 218, the conductive layer 218 is intentionally formed to partially fill the first trench 212, and a to-be-formed fill layer 220 (see FIG. 8) would be used to reflect the light back to the corresponding pixel.

Figure 8:
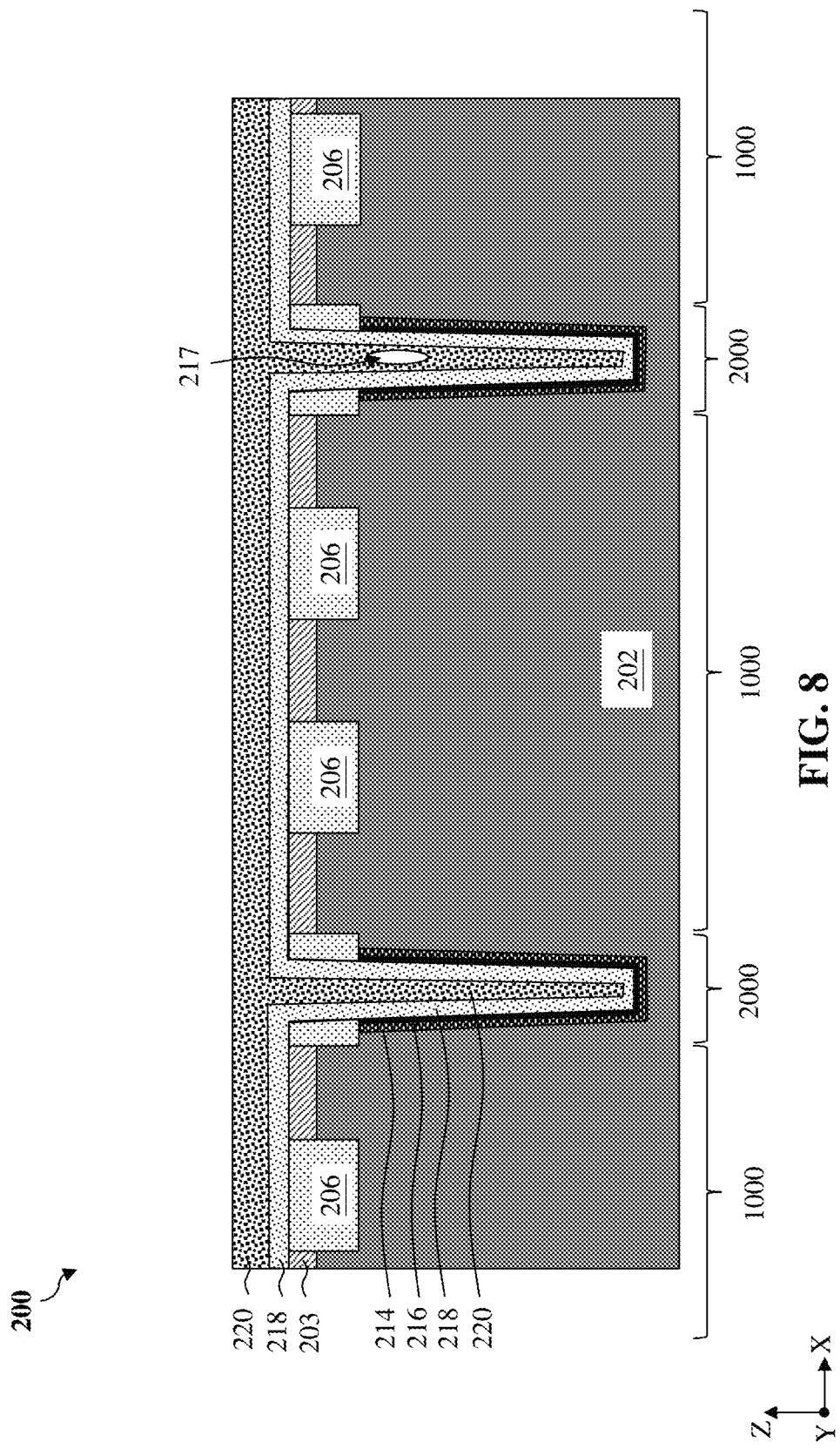

Referring to FIGS. 1 and 8, method 100 includes a block 112 where a fill layer 220 is formed over the workpiece 200 to substantially fill the first trench 212. In the present embodiments, the fill layer 220 is configured to have a composition different than that of the conductive layer 218. A refractive index of the fill layer 220 is smaller than a refractive index of the conductive layer 218, such that the incident light may be substantially or fully reflected back to the pixel which will be formed in the pixel region 1000 later. As a result, the quantum efficiency may be increased and the optical cross talk between adjacent pixels may be advantageously reduced or substantially eliminated. Therefore, a signal to noise ratio may be increased, and the image integrity may be improved. In some embodiments, the fill layer 220 may include silicon oxide, silicon nitride, silicon carbide, combinations thereof, or other suitable materials, and may be formed by any suitable method, including CVD, ALD, other methods, or combinations thereof. In an embodiment, the conductive layer 218 includes doped polycrystalline silicon, and the fill layer 220 includes silicon oxide. In some embodiments, the workpiece 200 may include a seam (or air gap or void) 217 sealed or surrounded by the fill layer 220, as shown in FIG. 8. In some embodiments, the fill layer 220 may be a multi-layer structure. For example, the deposition of the fill layer 220 may include conformally depositing a first fill layer over the conductive layer 218 and conformally depositing a second fill layer over the first fill layer. A composition of the second fill layer is different than a composition of the first fill layer, for example, to increase the reflectivity of the to-be-formed composite DTI structures 228.

Referring to FIGS. 1 and 9, method 100 includes a block 114 where the conductive layer 218 and the fill layer 220 are etched back by an etching process 224. In an embodiment, the etching process 224 selectively etches portions of the conductive layer 218 and the fill layer 220 over the first surface 202*a* and portions of the conductive layer 218 and the fill layer 220 in an upper portion of the first trench 212 to form a second trench 226 without substantially etching the protective layer 203. In embodiments where the dielectric liner 216 is formed by a deposition process, the etching process 224 may also recess the dielectric liner 216. The etching process 224 may be a dry etching process, a wet etching process, or a combination thereof that implements a suitable etchant. The recessed conductive layer 218, the recessed fill layer 220, the (recessed) dielectric liner 216, and the doped region 214 may be collectively referred to as a deep trench isolation (DTI) structure 228 that is formed in the lower portion of the first trench 212. In some embodiments, the DTI structure 228 may include the seam 217. In embodiments represented in FIG. 9, the conductive layer 218 is spaced apart from the first substrate 202 by the dielectric liner 216, and the fill layer 220 is spaced apart from the dielectric liner 216 by the conductive layer 218. In other words, the fill layer 220 is embedded in the conductive layer 218, and the conductive layer 218 is embedded in the dielectric liner 216, and a top surface of the DTI structure 228 includes a top surface of the conductive layer 218 and a top surface of the fill layer 220. The depth of the second trench 226 may be controlled by duration of the etching process 224. In embodiments represented in FIG. 9, a depth of the second trench 226 is substantially equal to the depth of the first STI structure 204 to prevent or reduce any current leakage at the front side of the workpiece 200. That is, a bottom surface of the first STI structure 204 may be substantially coplanar with a top surface of the DTI structure 228. In embodiments where there is a low etch selectivity between the first and second STI structures 204-206 and the fill layer 220, the first STI structures 204 and the second STI structures 206 may be slightly etched by the etching process 224.

Figure 10:
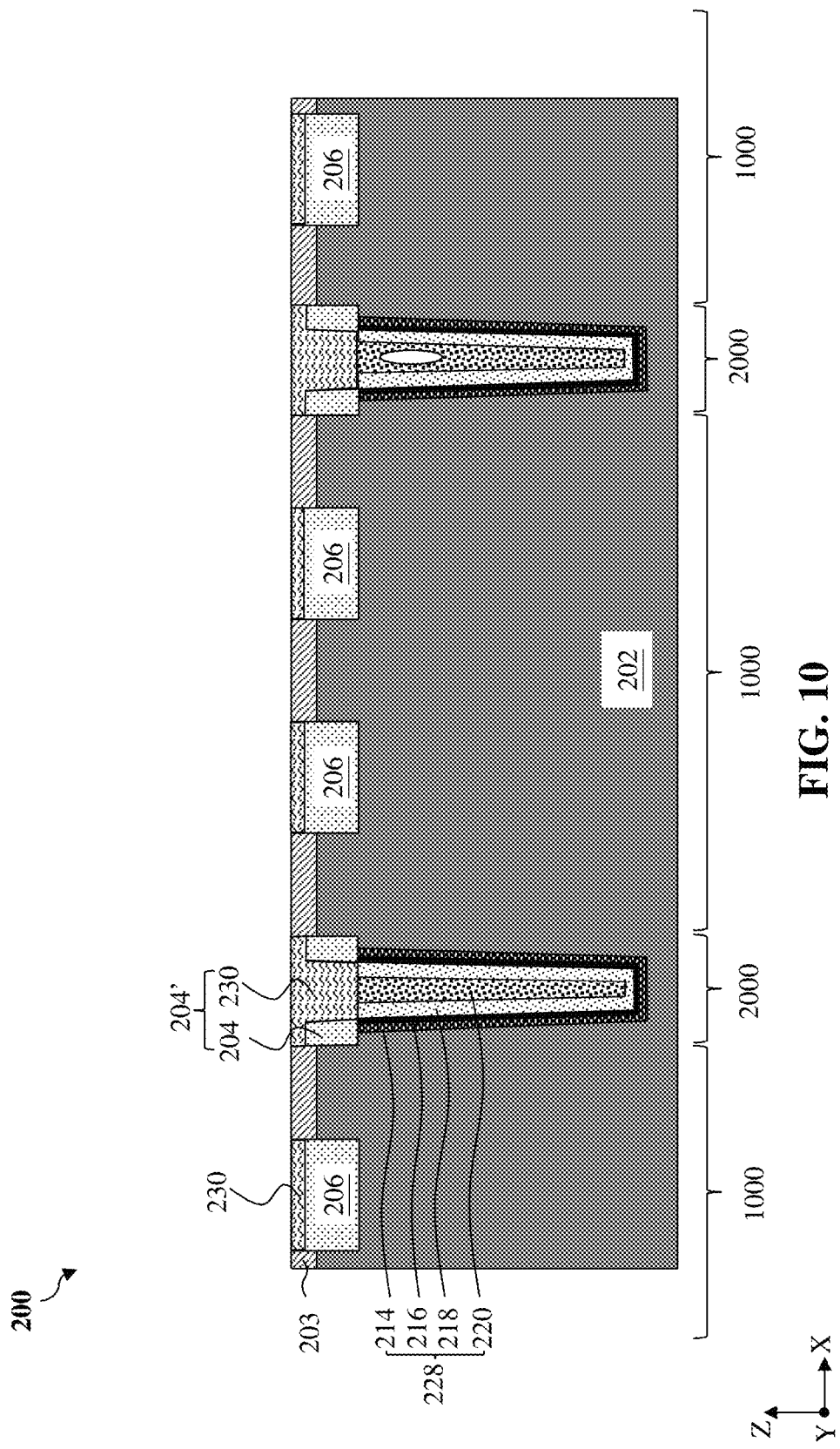

Referring to FIGS. 1 and 10, method 100 includes a block 116 where a dielectric layer 230 is deposited over the workpiece 200 to refill the second trench 226. The dielectric layer 230 may be referred to as a refill layer 230. The dielectric layer 230 is deposited over the workpiece 200 and in the second trench 226 using a suitable method, such as ALD, CVD, or other suitable methods. The dielectric layer 230 may include silicon oxide, silicon nitride, silicon oxycarbide, silicon oxycarbonitride, silicon carbonitride, metal nitride, or a suitable dielectric material. In some embodiments, a composition of the dielectric layer 230 may be the same as a composition of the first STI structure 204. For example, both the first STI structure 204 and the dielectric layer 230 may include silicon oxide. In some embodiments, a composition of the dielectric layer 230 may be different than a composition of the first STI structure 204. For example, the first STI structure 204 may include silicon oxide and the dielectric layer 230 may include silicon nitride.

Still referring to FIGS. 1 and 10, method 100 includes a block 118 where a planarization process is performed to remove excess dielectric material of the dielectric layer 230 over the protective layer 203, leaving the dielectric layer 230 in the second trench 226. The planarization process may include a CMP process and the CMP process may stop when it reaches the top surface of the protective layer 203. The conductive layer 218 in the DTI structure 228 is thus capped by the dielectric layer 230, leading to a reduced current leakage. In embodiments where the first STI structures 204 and the second STI structures 206 were slightly etched back by the etching process 224, the dielectric layer 230 is also formed on the recessed first STI structures 204 and the recessed second STI structures 206, as shown in FIG. 10. The first STI structure 204 and the dielectric layer 230 formed in the second trench 226 may be collectively referred to as the first STI structure 204'.

Figure 11:
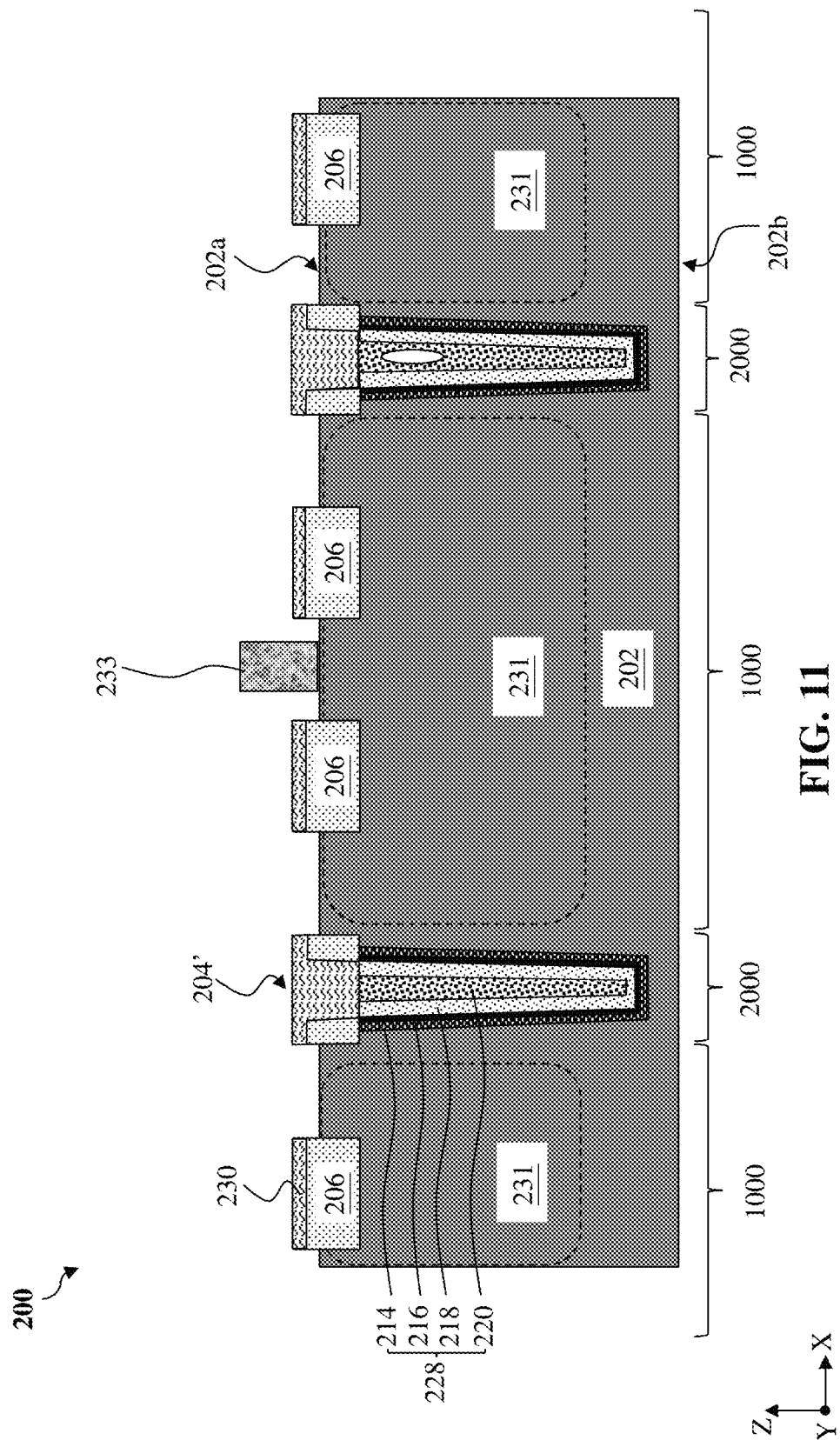

Referring to FIG. 11, the protective layer 203 may be selectively removed (e.g., using etchants that include phosphoric acid) to expose the first surface 202*a* of the first substrate 202. In some embodiments, after forming the DTI structures 228, components such as a photodiode 231 and a number of transistors (e.g., transfer transistor, reset transistor, source follower) may be formed to form a pixel (not explicitly shown) in each pixel region 1000. In some other implementations, each pixel may include a photodiode 231, and two or more pixels may share one or more of the number of transistors. Each of the transistors in the pixel may include a gate structure (such as gate structure 233 shown in FIG. 11) formed over the first surface 202*a* of the first substrate 202 in the pixel region 1000. Although not explicitly shown, the gate structure 233 may include a gate dielectric layer and a gate electrode layer over the gate dielectric layer. It is understood that photodiode 231 is for illustration purpose only and is not intended to limit the present disclosure to what is explicitly illustrated therein.

Figure 12:
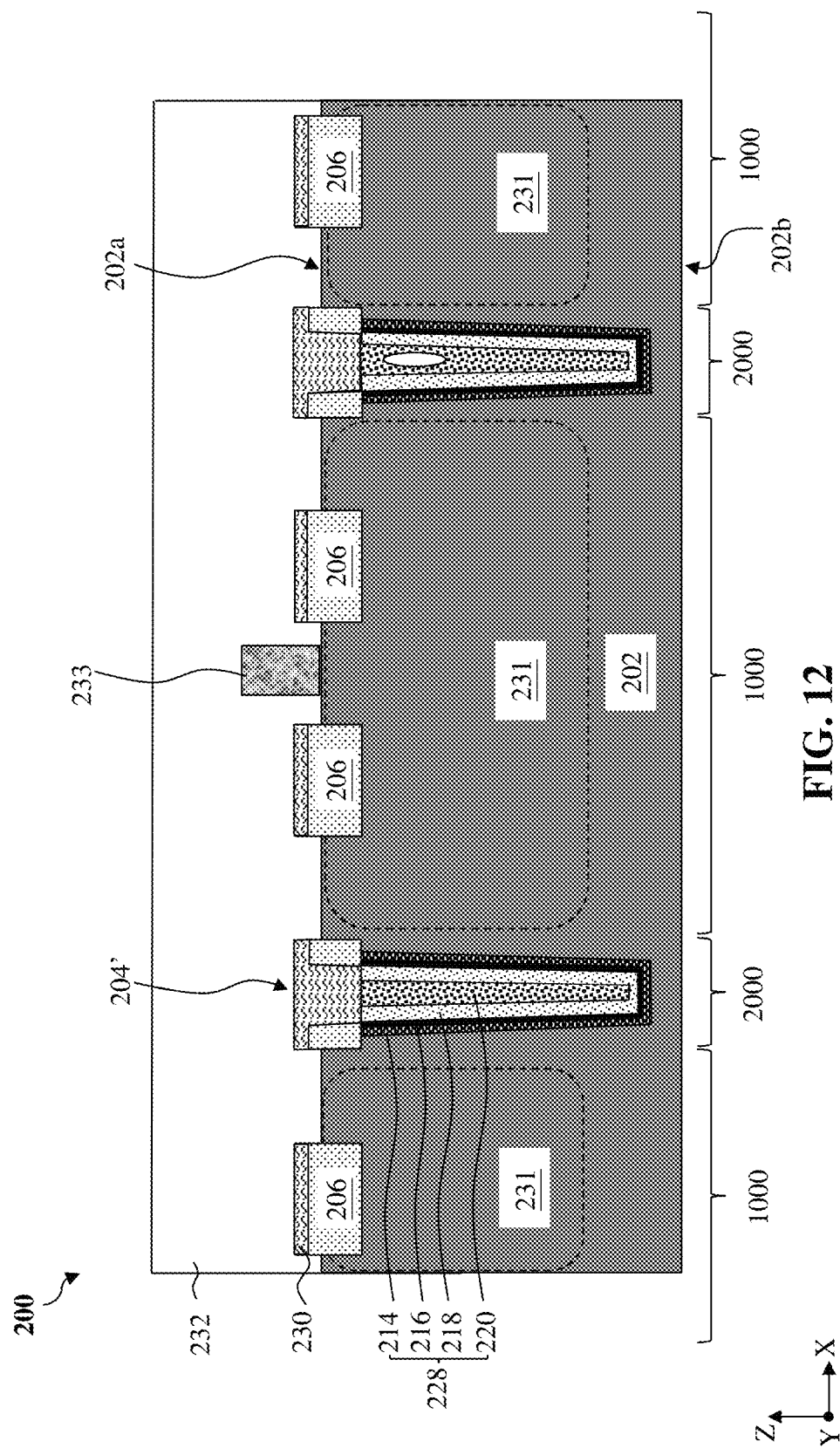

Referring to FIG. 12, after forming the photodiode 231 and transistors of the pixels in the pixel regions 1000, a first interconnect structure 232 is formed over the first surface 202*a* of the substrate 202. In some embodiments, the first interconnect structure 232 may include multiple interlayer dielectric (ILD) layers and multiple metal lines or contact vias in each of the ILD layers. The metal lines and contact vias in each ILD layer may be formed of metal, such as aluminum, tungsten, ruthenium, or copper. Because the first interconnect structure 232 is formed over the front side of the workpiece 200, the first interconnect structure 232 may also be referred to as a front-side interconnect structure 232. In embodiments where the first substrate 202 is a p-type substrate, a negative voltage may be applied to the conductive layer 218 to induce hole accumulation at the sidewall of the DTI structure 228 to isolate the dangling bonds and/or defects at the interface between the first substrate 202 and the DTI structure 228, thereby reducing dark current and white pixels. The negative voltage may be applied to the conductive layer 218 via the metal lines and contact vias in the first interconnect structure 232. In embodiments where the first substrate 202 is an n-type substrate, a positive voltage may be applied to the conductive layer 218 to induce electron accumulation at the sidewall of the DTI structure 228.

Figure 13:
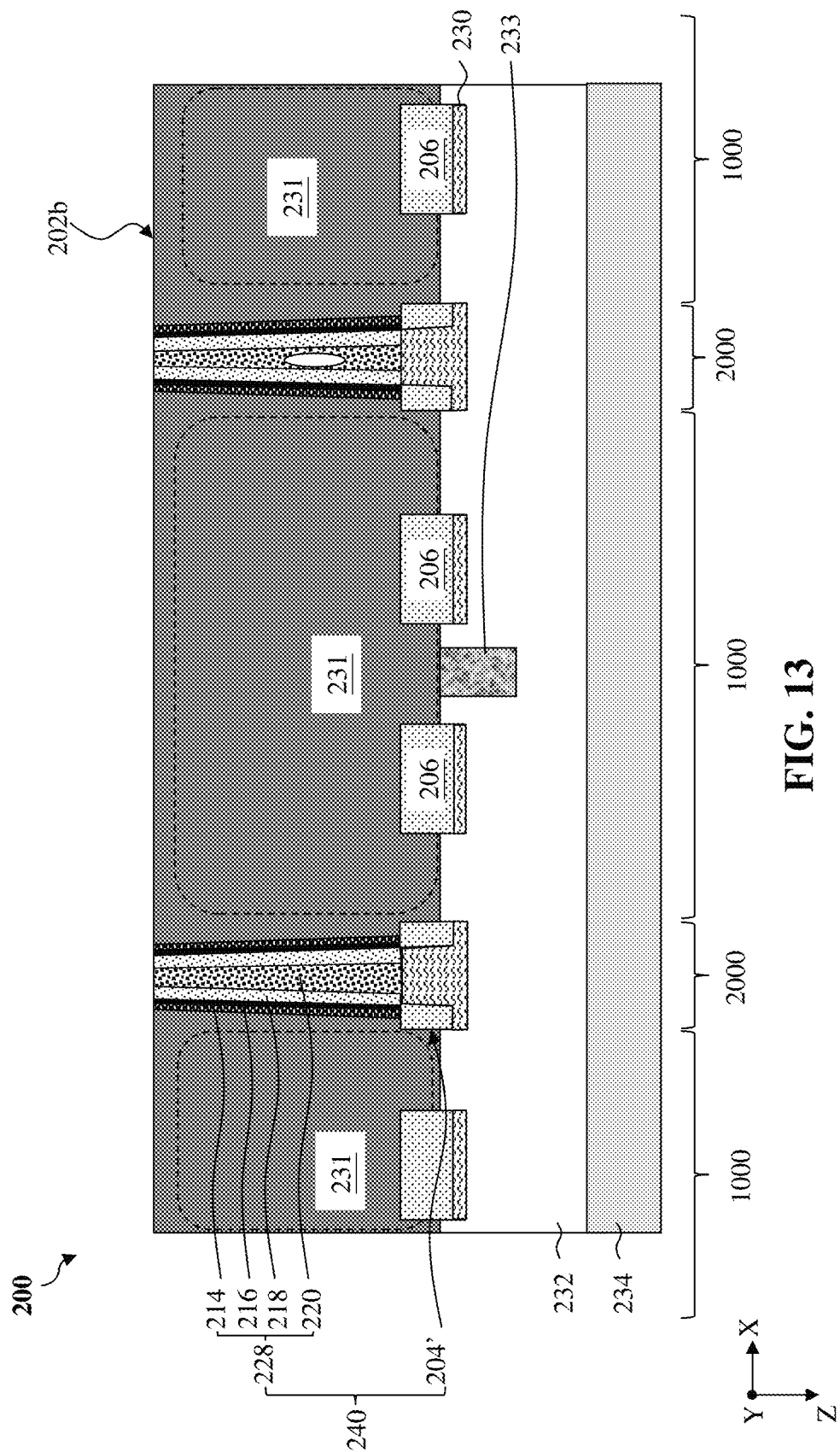

Referring to FIG. 13, after forming the first interconnect structure 232, a second substrate 234 is bonded to or attached to the first interconnect structure 232. In some embodiments, the second substrate 234 may be bonded to the workpiece 200 by fusion bonding, by use of an adhesion layer, or a combination thereof. In some instances, the second substrate 234 may be a carrier substrate and may include semiconductor materials (such as silicon), sapphire, glass, polymeric materials, or other suitable materials. In some embodiments, the second substrate 234 may include application specific integrated circuits (ASIC).

Referring to FIGS. 1 and 13, method 100 includes a block 120 where the workpiece 200 is flipped over, as shown in FIG. 13, where the first substrate 202 is at the top and is disposed over the first interconnect structure 232. Then, the workpiece 200 is thinned, planarized, recessed, or grinded from the second surface 202b until the fill layer 220 in the DTI structure 228 is exposed. A combination of the DTI structure 228 and the first STI structure 204' (including the first STI structure 204 and the refill layer 230) extends completely through the first substrate 202 and may be collectively referred to as a DTI structure 240. The pixel formed in a pixel region 1000 is then electrically and optically isolated from pixels in adjacent pixel regions 1000 by the DTI structures 240.

Figure 14:
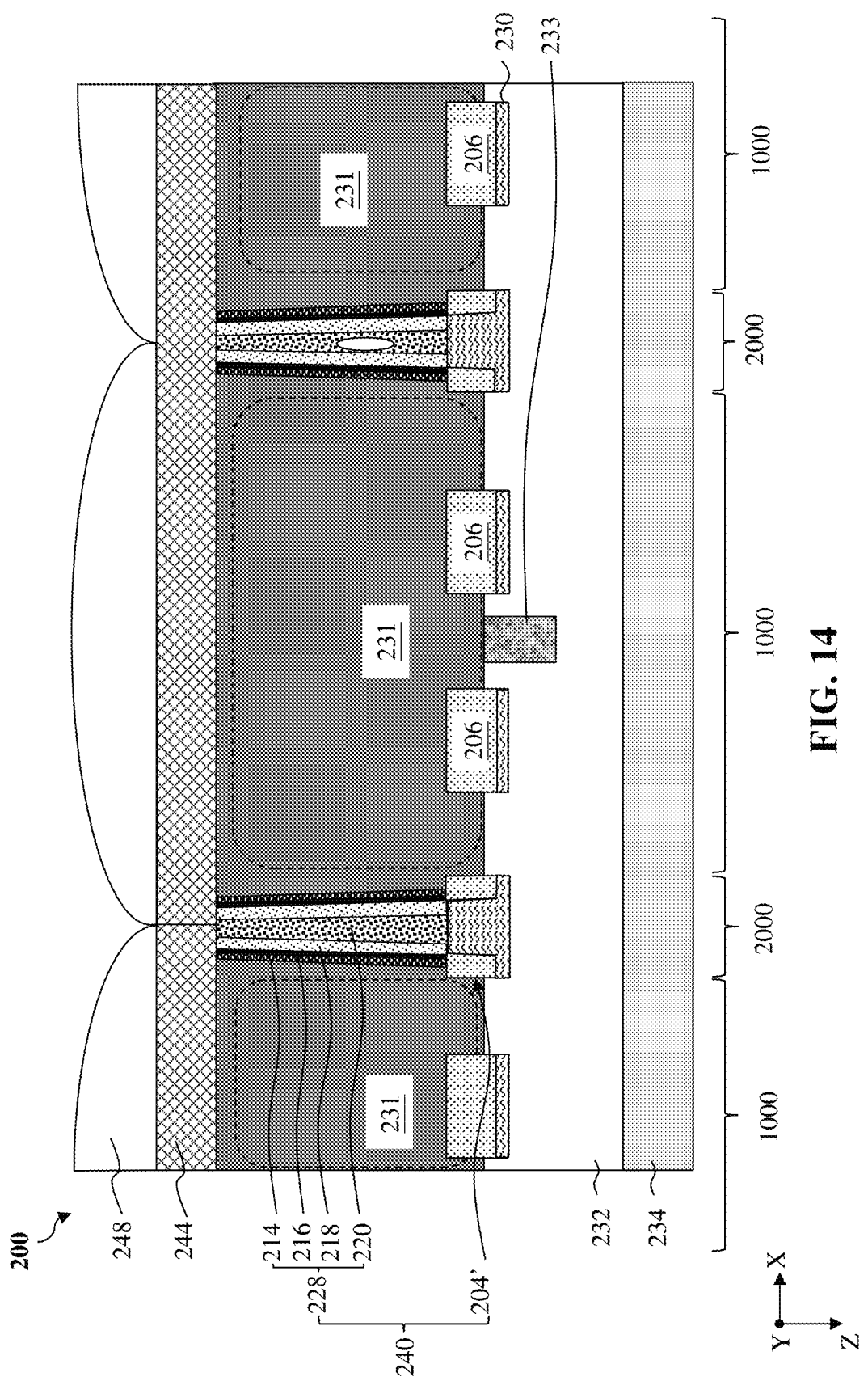
Figure 15:
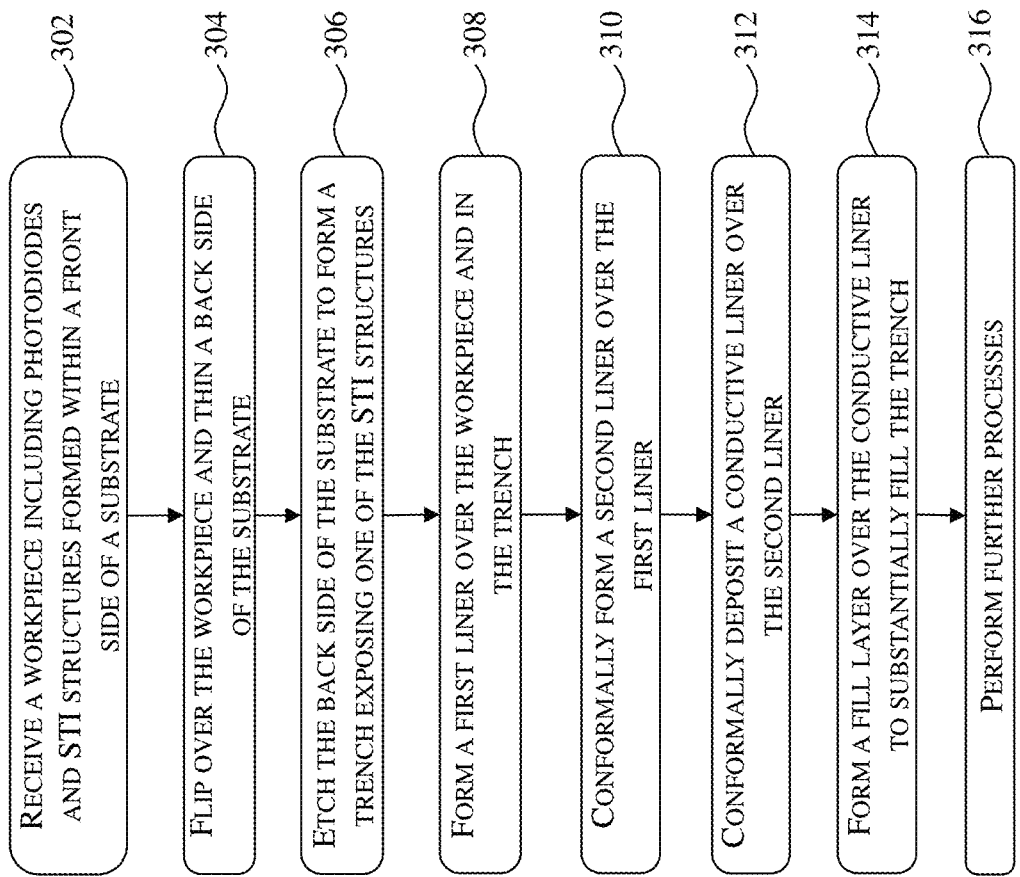
FIG. 15 illustrates a flowchart of another exemplary method for fabricating a semiconductor device having a DTI structure, according to various embodiments of the present disclosure.

Referring to FIGS. 1 and 14, method 100 includes a block 122 where further processes are performed. Such further process may include forming color filters 244 over the second surface 202b and overlaying photodiodes of the workpiece 200 and forming micro-lenses 248 over the color filters 244. Other suitable processes may be further performed to finish the fabrication of the semiconductor device 200, which is a back-side illuminated image sensor in an embodiment.

In the embodiments described above with reference to FIGS. 1-14, the DTI structure 228 is formed from the front side (e.g., first surface 202a) of the first substrate 202. In embodiments described with reference to FIGS. 15-22, a DIT structure is formed from the back side (e.g., second surface 202b) of the first substrate 202. Same reference numerals denote same features unless otherwise excepted, and repeated description is omitted for reason of simplicity.

Figure 16:
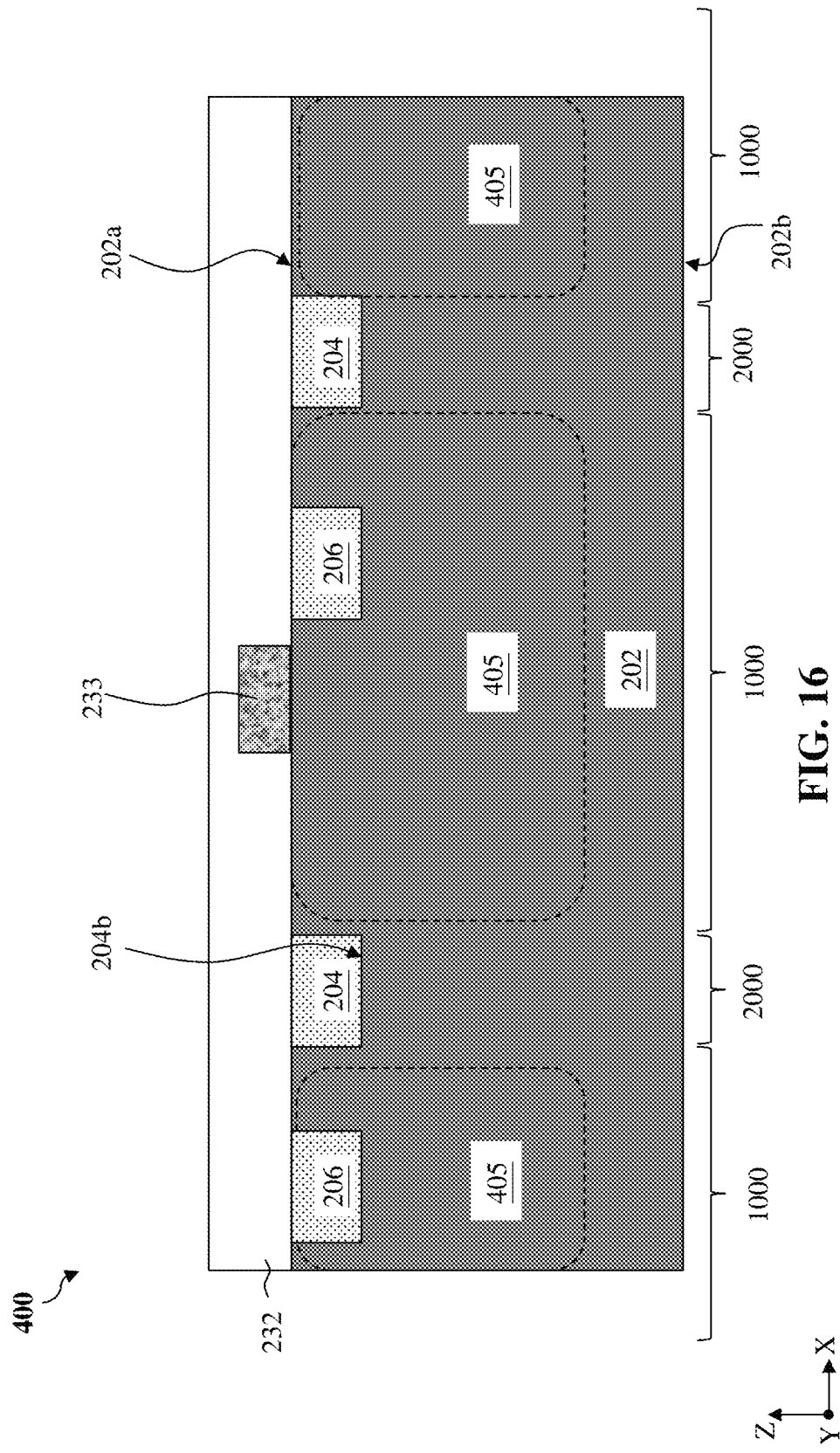
FIGS. 16, 17, 18, 19, 20, 21, and 22 illustrate fragmentary cross-sectional views of a workpiece during various fabrication stages in the method of FIG. 15, according to various aspects of the disclosure.

Now referring to FIGS. 15 and 16, method 300 includes a block 302 where a workpiece 400 is received. The workpiece 400 includes the first substrate 202 having the pixel regions 1000 and isolation regions 2000. As described above with reference to FIG. 2, each isolation region 2000 is disposed between two adjacent pixel regions 1000. The workpiece 400 also includes a number of pixels. Each pixel is formed in a corresponding pixel region 1000 and may include a photodiode 405 in a way similar to the photodiode 231 described above with reference to FIG. 11 and one or more transistors having the gate structure 233. It is noted that the photodiode 405 shown in FIG. 16 is for illustration purpose only and is not intended to limit the present disclosure to what is explicitly illustrated therein. The workpiece 400 also includes a number of the first STI structures 204 and each of the first STI structures 204 is formed in a corresponding isolation region 2000. The first STI structure 204 includes a bottom surface 204b. The workpiece 400 also includes a number of the second STI structures 206 and each of the second STI structures 206 is formed in a corresponding pixel region 2000 to isolate adjacent components (e.g., transistors) in the pixel. The number of second STI structures 206 in the pixel region 1000 is merely an example and is not intended to be limiting. For example, some pixels in the workpiece 400 may not include the second STI structures 206 in some embodiments. The workpiece 400 also includes the first interconnect structure 232 formed over the first surface 202a of the first substrate 202.

Figure 17:
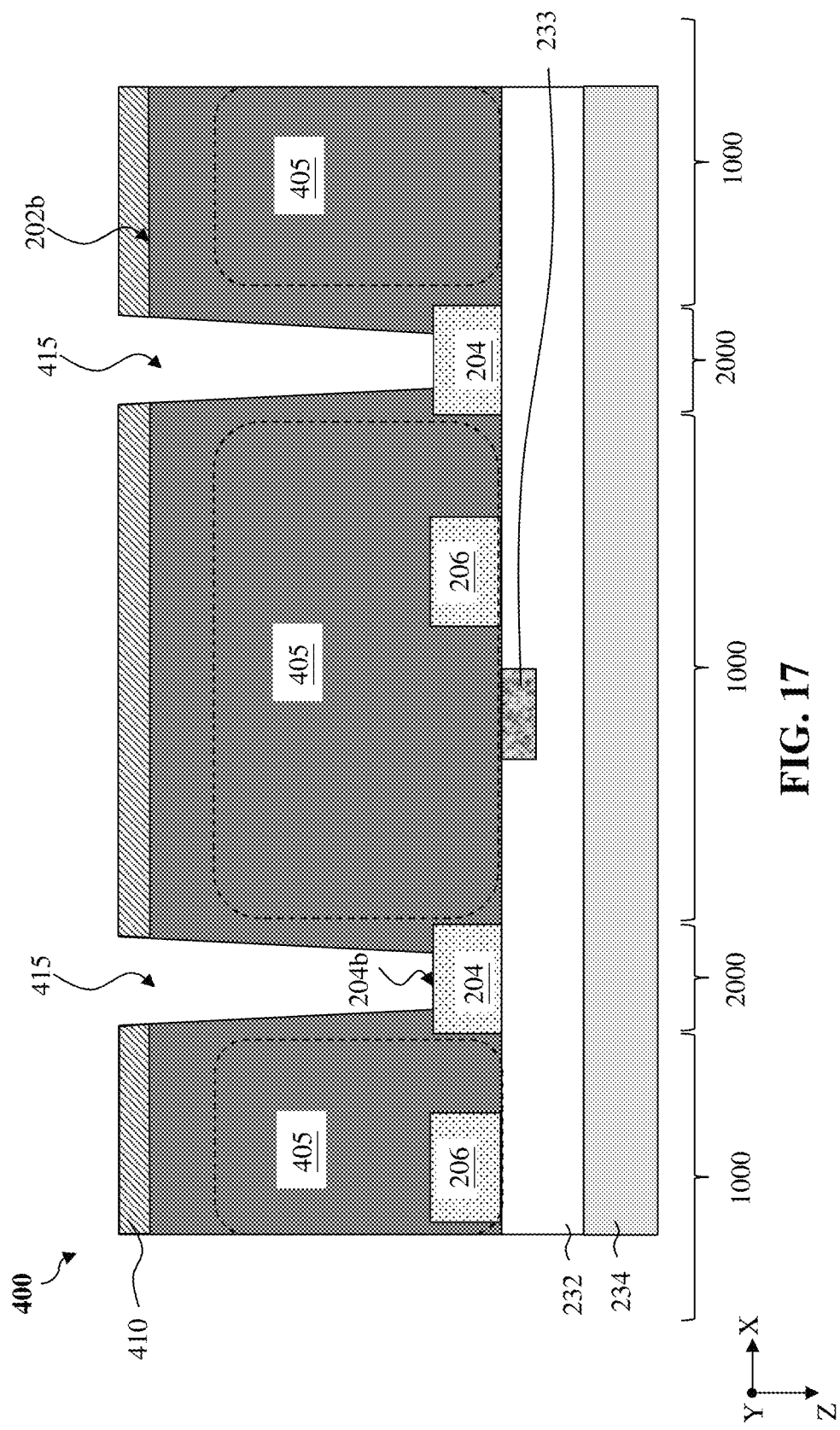

Referring to FIGS. 15 and 17, method 300 includes a block 304 where the workpiece 400 is flipped over and thinned to a predetermined thickness for forming a satisfactory back-side trench isolation structure. In embodiments represented in FIG. 17, after forming the first interconnect structure 232, the second substrate 234 is bonded to or attached to the first interconnect structure 232, and the workpiece 400 is then flipped over and planarized, recessed, or grinded from the second surface 202b. A pattern film 410 is then formed over the second surface 202b of the first substrate 202 and patterned to form a number of openings exposing portions of the first substrate 202, as shown in FIG. 17. The pattern film 410 may be a hard mask layer that is in a way similar to the hard mask layer 208 or may be a photoresist layer.

Referring to FIGS. 15 and 17, method 300 includes a block 306 where an etching process is performed to etch the back side of the first substrate 202 to form trenches 415 exposing the first STI structures 204. The etching process is performed using the patterned pattern film 410 as an etch mask to form a number of trenches 415 extending from the bottom surface 202b of the first substrate 202 towards the first STI structures 204. That is, the trench 415 exposes a portion of the first STI structure 204. In embodiments represented in FIG. 17, the trench 415 exposes a portion of the bottom surface 204b of the first STI structure 204. In some other embodiments, the trench 415 may also expose a sidewall surface of the first STI structure 204. The etching process may be a dry etching process, a wet etching process, or a combination thereof that implements a suitable etchant. It is noted that, since photodiodes 405 and transistors of pixels are already formed in the pixel regions 1000, to ensure the reliabilities of the components such as photodiodes 405 and transistors of the pixels, the trenches 415 are not doped with ions that would require a high temperature process (e.g., annealing) for dopant activation.

Figure 18:
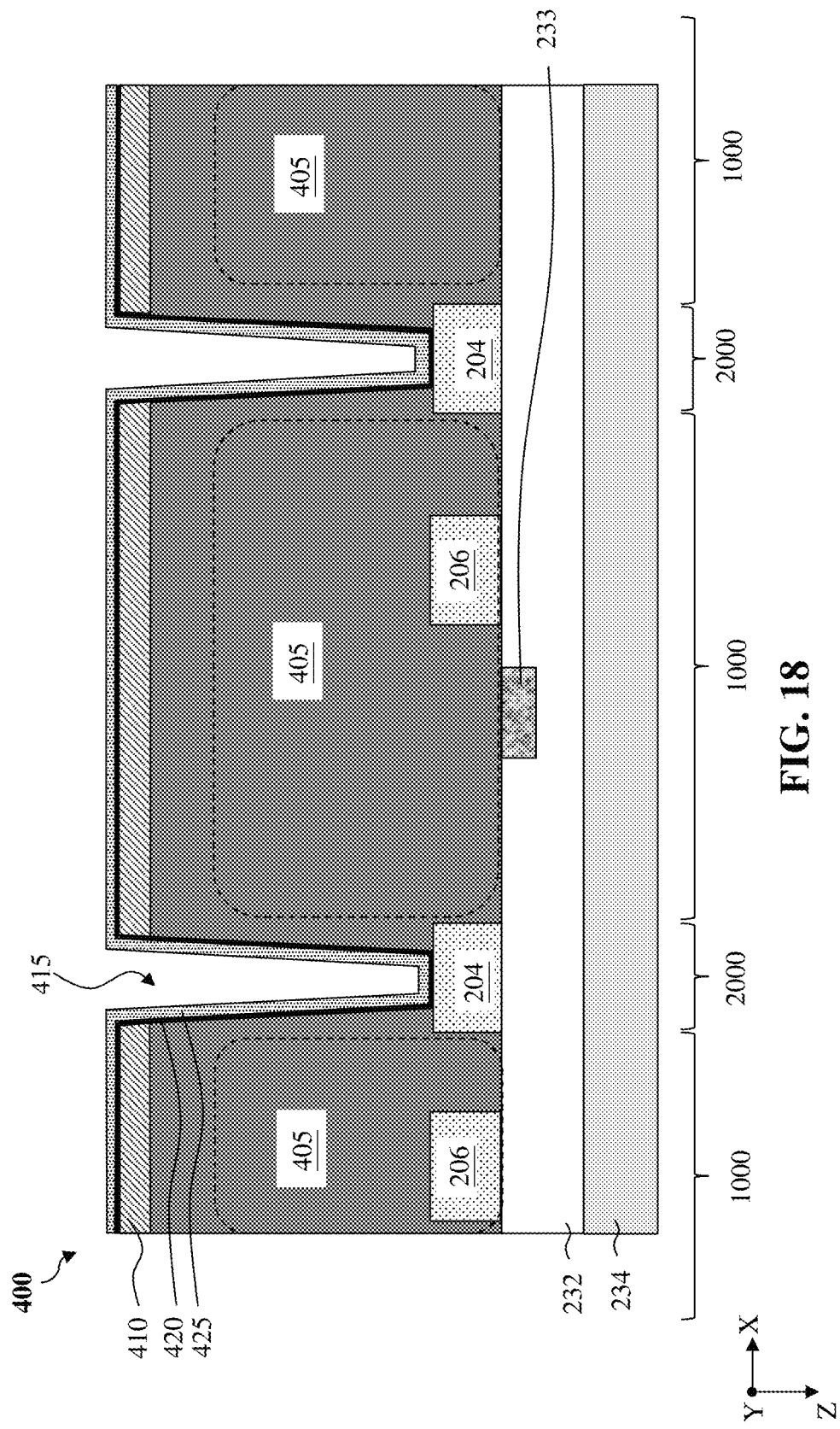

Referring to FIGS. 15 and 18, method 300 includes a block 308 where a first dielectric liner 420 is formed on the sidewall and bottom surfaces of the trench 415 and over the workpiece 400. In an embodiment, the first dielectric liner 420 is conformally deposited to have a generally uniform thickness over the top surface of the workpiece 400 and partially fills the trench 415. Since components such as photodiodes 405 and transistors of pixels are already formed in the pixel regions 1000, the first dielectric liner 420 is formed under a low temperature such that the formation of the first dielectric liner 420 would not significantly damage the components in the pixel regions 1000. For example, the first dielectric liner 420 is formed under 400° C. In some embodiments, the first dielectric liner 420 may be formed by a plasma oxidization process, a CVD process, or other suitable processes. The first dielectric liner 420 may be formed of a silicon oxide, silicon nitride, silicon oxycarbonitride, silicon carbonitride, silicon oxynitride, TEOS, doped silicon oxide (e.g., BPSG, FSG, PSG, BSG, etc.), or other suitable materials. In an embodiment, the first dielectric liner 420 is formed of a low-k dielectric layer.

Still Referring to FIGS. 15 and 18, method 300 includes a block 310 where a second dielectric liner 425 is conformally formed over the first dielectric liner 420 and in the trench 415. The second dielectric liner 425 may be formed by performing a deposition process such as a CVD process, an ALD process, or other suitable deposition process. The second dielectric liner 425 may include high-k (having a dielectric constant greater than that of silicon oxide, which is approximately 3.9) dielectric materials such as hafnium oxide, titanium oxide ($TiO_2$), hafnium zirconium oxide (HfZrO), tantalum oxide ($Ta_2O_5$), hafnium silicon oxide ($HfSiO_4$), zirconium oxide, zirconium silicon oxide ($ZrSiO_2$), lanthanum oxide ($La_2O_3$), aluminum oxide ($Al_2O_3$), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. Forming the high-k second dielectric liner 425 may enhance the carrier accumulation at the sidewall of the trench 415, thereby reducing dark current and white pixels. It is noted that the second dielectric liner 425 is optional and related operations that are used to form the second dielectric liner 425 (i.e., operation in block 310 of FIG. 15) could be omitted in some embodiments.

Figure 19:
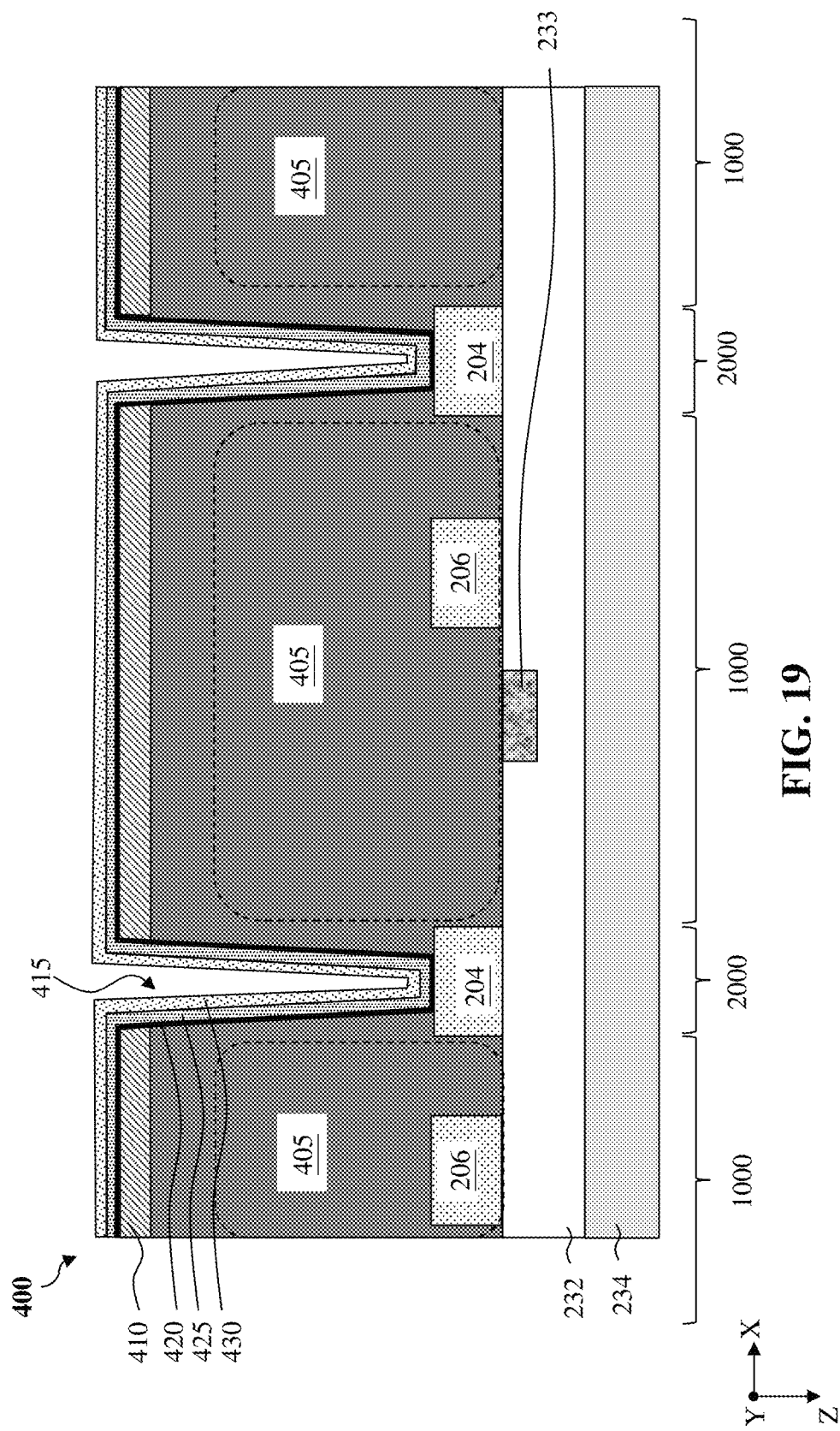

Referring to FIGS. 15 and 19, method 300 includes a block 312 where a conductive layer 430 is conformally formed over the second dielectric liner 425 and in the trench 415. The conductive layer 430 is spaced apart from the first substrate 202 by the first dielectric liner 420 and the second dielectric liner 425. The conductive layer 430 is also spaced apart from the first STI structure 204 by the first dielectric liner 420 and the second dielectric liner 425. Different from the embodiment described with reference to FIG. 7, the conductive layer 430 is formed after the forming of the photodiodes 405 and transistors of the pixels. Therefore, to avoid a high temperature process (e.g., annealing process) used to activate dopants in the doped polycrystalline silicon, the conductive layer 430 doesn't include doped polycrystalline silicon. In some embodiments, the conductive layer 430 may include titanium nitride (TiN), tantalum nitride (TaN), aluminum (Al), tungsten (W), nickel (Ni), titanium (Ti), ruthenium (Ru), cobalt (Co), platinum (Pt), copper (Cu), or other suitable metal materials or a combination thereof. In various embodiments, the conductive layer 430 may be formed by ALD, PVD, CVD, or other suitable process. In some embodiments, a bias voltage may be applied to the conductive layer 430 to induce carrier accumulation and thus reduce dark current.

Figure 20:
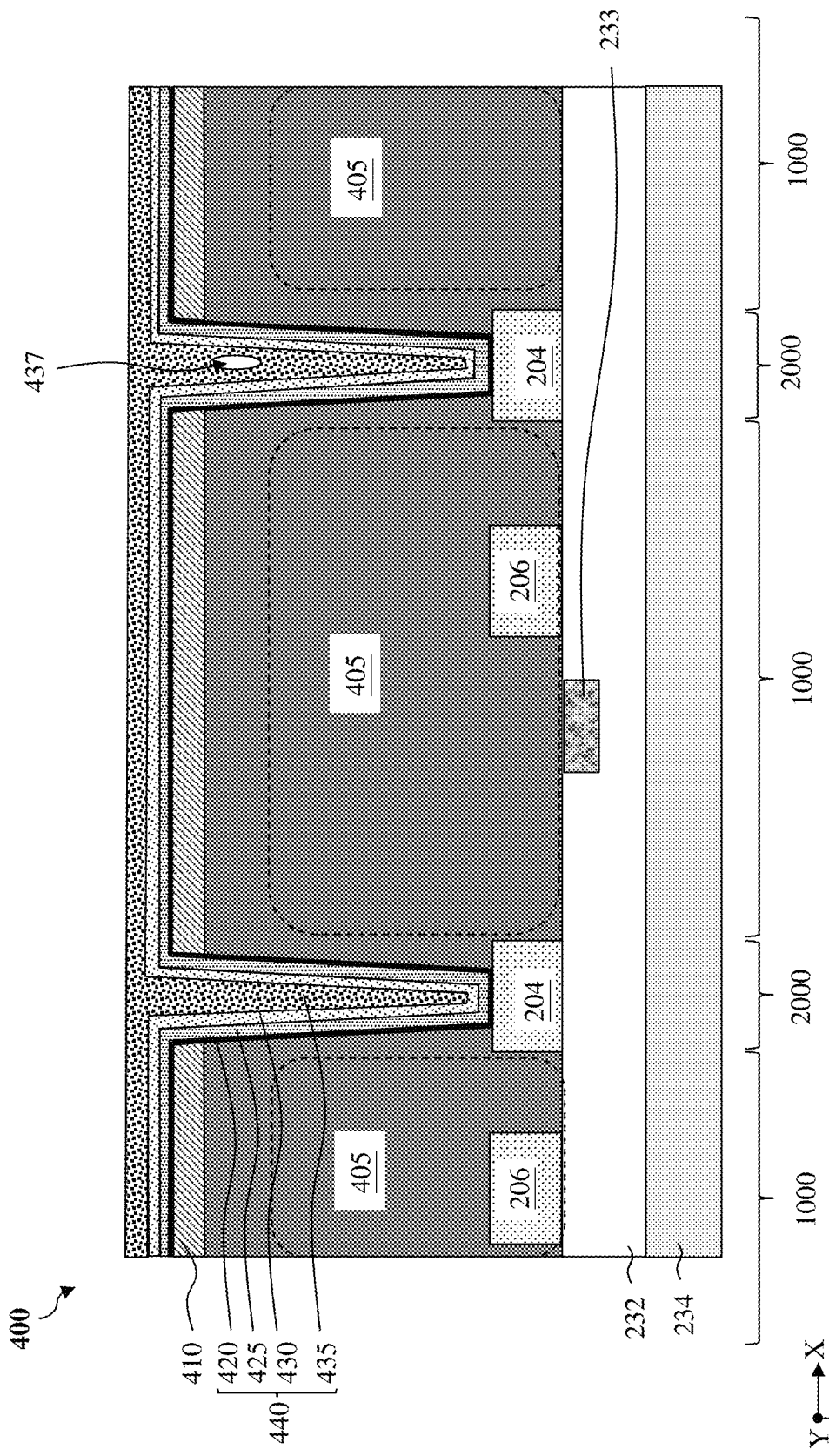
Figure 21:
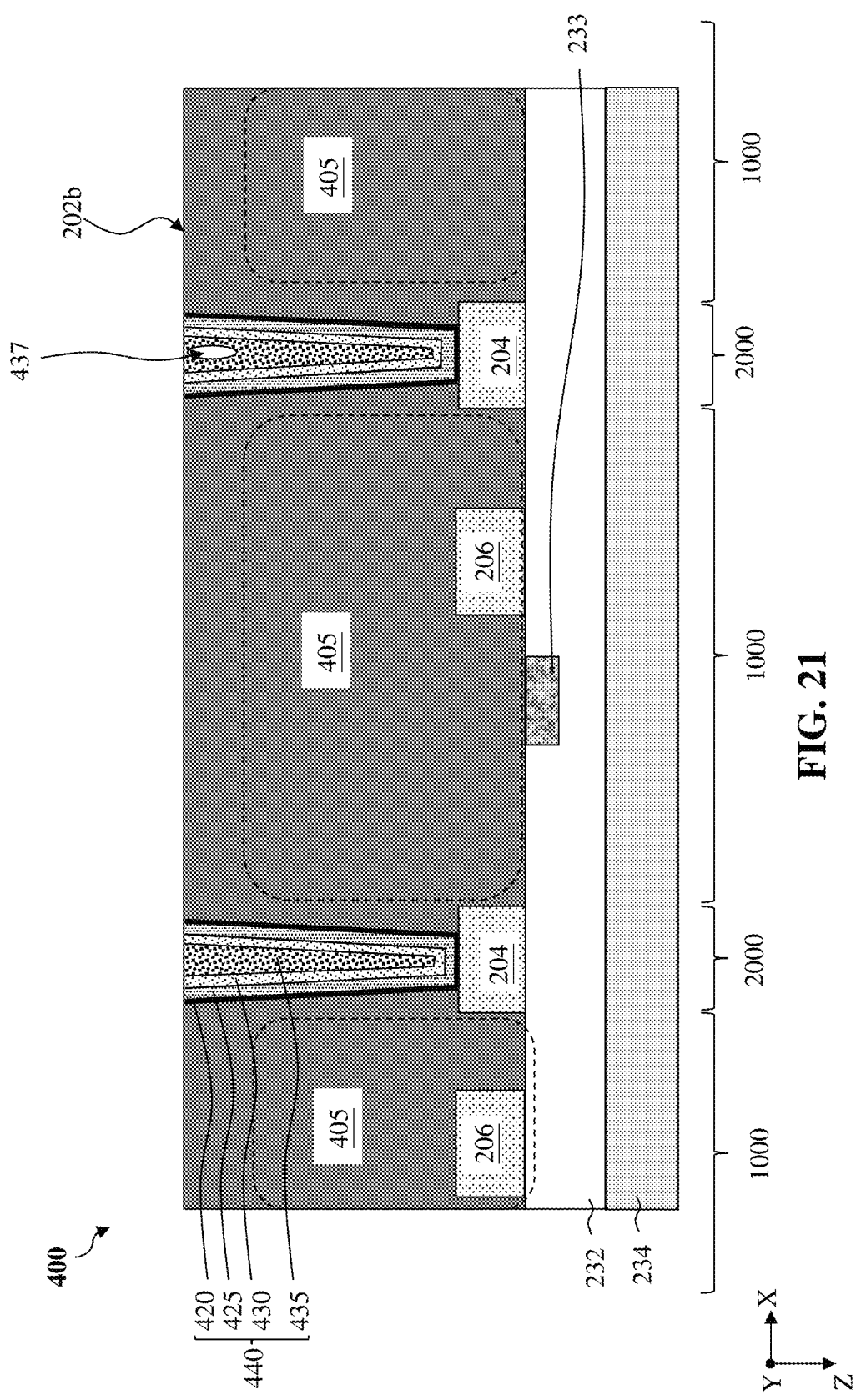

Referring to FIGS. 15 and 20-21, method 300 includes a block 314 where a fill layer 435 is deposited over the workpiece 400 to substantially fill the trench 415. In some embodiments, the conductive layer 430 may absorb a portion of incident light and/or reflect only a portion of incident light to the corresponding pixel. The refractive index of the fill layer 435 may be smaller than that of the conductive layer 430, such that the fill layer 435 may reflect a substantial portion of the incident light to the corresponding pixel. As a result, the quantum efficiency may be increased and the optical cross talk between adjacent pixels may be advantageously reduced or substantially eliminated. The fill layer 435 may include silicon oxide, silicon nitride, silicon carbide, combinations thereof, or other suitable materials, and may be formed by any suitable method, including CVD, ALD, other methods, or combinations thereof. The first dielectric liner 420, the second dielectric liner 425, the conductive layer 430, and the fill layer 435 may be collectively referred to as an isolation structure 440. In some embodiments, the workpiece 400 may include a seam (or an air gap or a void) 437 that is sealed or surrounded by the fill layer 435, such as shown in the right one of the isolation structures 440 in FIG. 20.

Referring to FIG. 21, after forming the isolation structure 440, a planarization process may be performed to remove excess materials and finalize a final structure of the isolation structure 440. For example, the planarization process may remove the patterned pattern film 410 and materials over the patterned pattern film 410. A combination of the isolation structure 440 and the first STI structure 204 extends completely through the first substrate 202. The neighboring pixels formed in neighboring pixel regions 1000 may be then electrically and optically isolated from each other by the combination of the isolation structure 440 and the first STI structure 204.

Figure 22:
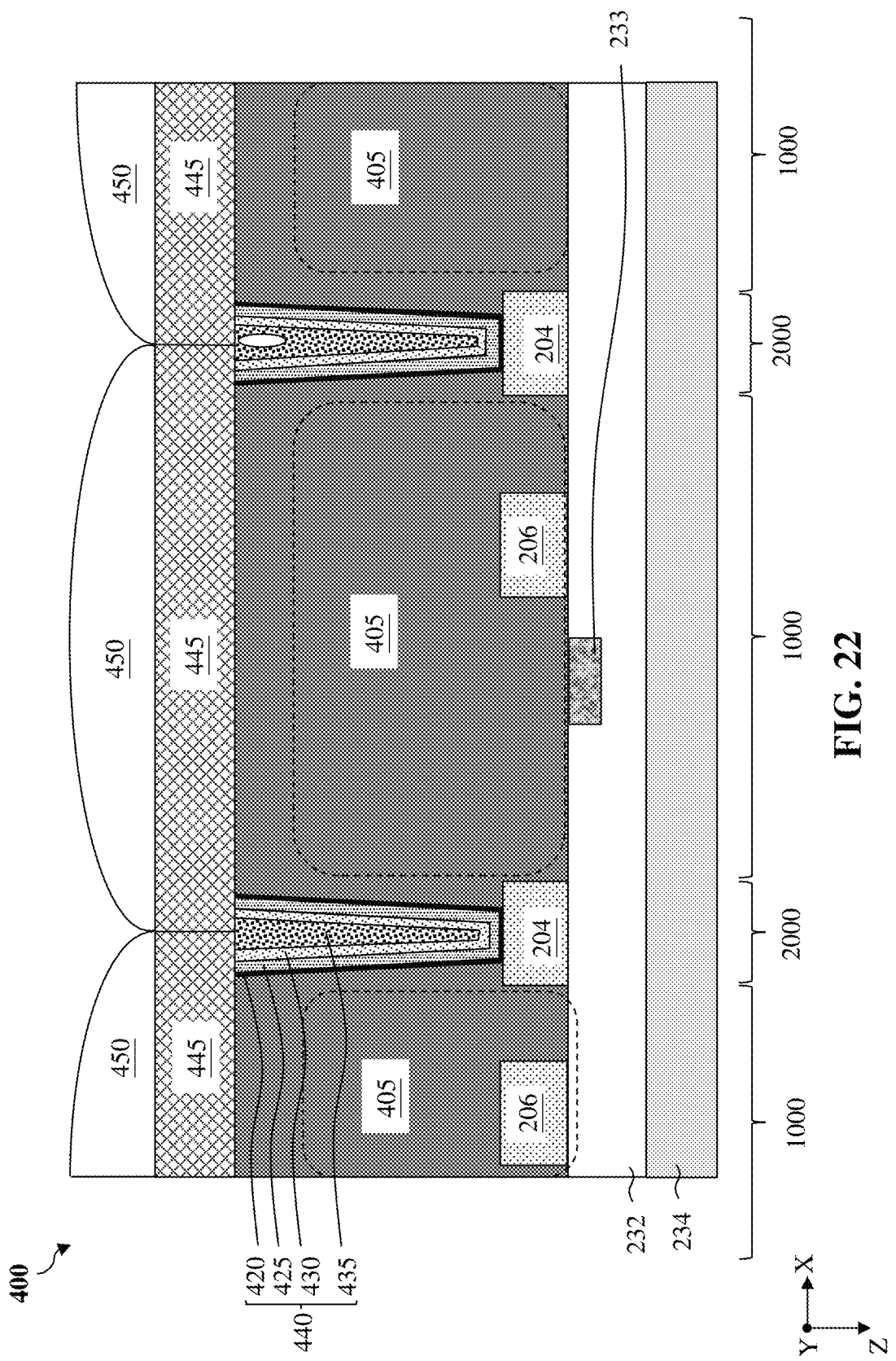

Referring to FIGS. 15 and 22, method 300 includes a block 316 where further processes are performed. Such further process may include forming color filters 445 over the second surface 202b and overlaying photodiodes of the workpiece 400. Such further process may include forming micro-lenses 450 over the color filters 445. Other suitable processes may be further performed to finish the fabrication of the semiconductor device 400.

Although not intended to be limiting, one or more embodiments of the present disclosure provide many benefits to image sensors and an imaging system. For example, by forming the hybrid DTI structure, a pixel may be both electrically and optically isolated from its neighboring pixels. Optical cross talk may be advantageous reduced or even substantially eliminated, and quantum efficiency may be advantageously increased. Further, the disclosed methods can be easily integrated into existing semiconductor manufacturing processes.

The present disclosure provides for many different embodiments. Semiconductor devices and methods of fabrication thereof are disclosed herein. In one exemplary aspect, the present disclosure is directed to a method for forming an image sensor. The method includes receiving a workpiece comprising a first isolation structure formed in a front side of a substrate, forming a trench extending through the first isolation structure and a portion of the substrate, forming a dielectric liner to line the trench, depositing a conductive layer conformally over the workpiece after the forming of the dielectric liner, and depositing a dielectric fill layer over the conductive layer to fill the trench. In some embodiments, a refractive index of the conductive layer may be greater than a refractive index of the dielectric fill layer. In some embodiments, the conductive layer may include doped polycrystalline silicon, titanium nitride, aluminum, or tungsten. In some embodiments, the dielectric fill layer may include silicon oxide, silicon nitride, or silicon carbide. In some embodiments, the method may also include forming an interconnect structure over the front side of the substrate. The interconnect structure may include an interlayer dielectric layer and a conductive feature in the interlayer dielectric layer and the conductive feature may be electrically coupled to the conductive layer. The method may also include applying a bias voltage to the conductive layer via the conductive feature. In some embodiments, the depositing of the dielectric fill layer may include conformally depositing a first dielectric fill layer over the conductive layer and conformally depositing a second dielectric fill layer over the first dielectric fill layer, and a composition of the second dielectric fill layer is different than a composition of the first dielectric fill layer. In some embodiments, the method may also include etching back the conductive layer and the dielectric fill layer to form a recess in the trench, depositing a dielectric layer over the workpiece to fill the recess, and performing a planarization process to the workpiece. In some embodiments, the workpiece may include a protective layer formed on the front side of the substrate. A top surface of the protective layer may be coplanar with a top surface of the first isolation structure, and the performing of the planarization process may include removing excess materials on the protective layer. In some embodiments, the method may also include, after the depositing of the dielectric fill layer, flipping over the workpiece, and performing a planarization process to a back side of the substrate to expose the dielectric fill layer. The back side of the substrate is opposite to the front side of the substrate. In some embodiments, the method may also include, before the performing of the planarization process to the back side of the substrate, forming a first photosensitive device and a second photosensitive device in the substrate. The first photosensitive device is isolated from the second photosensitive device by the dielectric liner, the conductive layer and the dielectric fill layer. In some embodiments, the forming of the dielectric liner may include performing a thermal oxidization to the workpiece, and after the depositing of the conductive layer, a first portion of the conductive layer is in direct contact with the dielectric liner and a second portion of the conductive layer is in direct contact with the first isolation structure. In some embodiments, the forming of the dielectric liner may include performing a deposition process to the workpiece, and the conductive layer is spaced apart from the first isolation structure by the dielectric liner. In some embodiments, the forming of the trench may include forming a patterned hard mask layer over the workpiece. The patterned hard mask layer may include an opening exposing a portion of the first isolation structure. The forming of the trench may also include performing an etching process using the patterned hard mask layer as an etch mask to remove the portion of the first isolation structure and the portion of the substrate, and the portion of the substrate is directly under the portion of the first isolation structure.

In another exemplary aspect, the present disclosure is directed to a method for forming an image sensor. The method includes receiving a workpiece comprising a first isolation structure formed in a front side of a substrate, forming a trench extending through the first isolation structure and a portion of the substrate, forming a doped region along sidewall and bottom surfaces of the trench, the doped region comprising dopants having the same doping polarity as the substrate, forming a dielectric liner to line the trench after the forming of the doped region, depositing a conductive layer conformally over the workpiece after the forming of the dielectric liner, and depositing a dielectric fill layer over the conductive layer to fill the trench.

In yet another exemplary aspect, the present disclosure is directed to a semiconductor device. The semiconductor device includes a substrate having a front-side surface and a back-side surface, a first photosensitive device and a second photosensitive device disposed in the substrate, and an isolation structure extending through the substrate and disposed between the first photosensitive device and the second photosensitive device. The isolation structure includes an upper portion and a lower portion directly under the upper portion, and the upper portion is closer to the front-side surface than the lower portion. The lower portion includes a first dielectric layer extending from the upper portion to the back-side surface, a conductive layer surrounding a sidewall surface of the first dielectric layer, and a second dielectric layer surrounding a sidewall surface of the conductive layer. The first dielectric layer is spaced apart from the second dielectric layer by the conductive layer.

In some embodiments, the conductive layer may be biased to a predetermined voltage. In some embodiments, a refractive index of the conductive layer may be greater than a refractive index of the first dielectric layer. In some embodiments, the semiconductor device may also include a first color filter disposed under the first photosensitive device and a second color filter disposed under the second photosensitive device. In some embodiments, the conductive layer may include a doped polycrystalline silicon, and the first dielectric layer may include silicon oxide. In some embodiments, the lower portion may also include a doped region surrounding a sidewall surface of the second dielectric layer, the doped region may include dopants having a first doping polarity, and the first and second photosensitive devices may include another doped region having a second polarity opposite to the first doping polarity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, comprising:
 receiving a workpiece comprising a first isolation structure formed in a front side of a substrate;
 forming a trench extending through the first isolation structure and a portion of the substrate;
 performing a thermal oxidization to the workpiece, thereby forming a dielectric liner to line the trench;
 after the forming of the dielectric liner, depositing a conductive layer conformally over the workpiece, wherein the conductive layer comprises a first portion in direct contact with the dielectric liner and a second portion in direct contact with the first isolation structure; and
 depositing a dielectric fill layer over the conductive layer to fill the trench.

2. The method of claim 1, wherein a refractive index of the conductive layer is greater than a refractive index of the dielectric fill layer.

3. The method of claim 1, wherein the conductive layer comprises doped polycrystalline silicon, titanium nitride, aluminum, or tungsten.

4. The method of claim 1, wherein the dielectric fill layer comprises silicon oxide, silicon nitride, or silicon carbide.

5. The method of claim 1, further comprising:
 forming an interconnect structure over the front side of the substrate, the interconnect structure comprising an interlayer dielectric layer and a conductive feature in the interlayer dielectric layer, wherein the conductive feature is electrically coupled to the conductive layer; and
 applying a bias voltage to the conductive layer via the conductive feature.

6. The method of claim 1,
 wherein the depositing of the dielectric fill layer comprises conformally depositing a first dielectric fill layer over the conductive layer, and conformally depositing a second dielectric fill layer over the first dielectric fill layer, wherein a composition of the second dielectric fill layer is different than a composition of the first dielectric fill layer.

7. The method of claim 1, further comprising:

etching back the conductive layer and the dielectric fill layer to form a recess in the trench;

depositing a dielectric layer over the workpiece to fill the recess; and performing a planarization process to the workpiece.

8. The method of claim 7, wherein the workpiece further comprises a protective layer formed on the front side of the substrate, wherein a top surface of the protective layer is coplanar with a top surface of the first isolation structure, and wherein the performing of the planarization process comprises removing excess materials on the protective layer.

9. The method of claim 1, further comprising:

after the depositing of the dielectric fill layer, flipping over the workpiece; and performing a planarization process to a back side of the substrate to expose the dielectric fill layer, the back side of the substrate being opposite to the front side of the substrate.

10. The method of claim 9, further comprising:

before the performing of the planarization process to the back side of the substrate, forming a first photosensitive device and a second photosensitive device in the substrate, wherein the first photosensitive device is isolated from the second photosensitive device by the dielectric liner, the conductive layer and the dielectric fill layer.

11. The method of claim 1, wherein the forming of the trench comprises:

forming a patterned hard mask layer over the workpiece, the patterned hard mask layer comprising an opening exposing a portion of the first isolation structure; and performing an etching process using the patterned hard mask layer as an etch mask to remove the portion of the first isolation structure and the portion of the substrate, wherein the portion of the substrate is directly under the portion of the first isolation structure.

12. A method for forming an image sensor, comprising:

receiving a workpiece comprising a first isolation structure formed in a front side of a substrate;

forming a trench extending through the first isolation structure and a portion of the substrate;

forming a doped region along sidewall and bottom surfaces of the trench, the doped region comprising dopants having a same doping polarity as the substrate;

after the forming of the doped region, forming a dielectric liner to line the trench;

after the forming of the dielectric liner, depositing a conductive layer conformally over the workpiece; and depositing a dielectric fill layer over the conductive layer to fill the trench.

13. The method of claim 12, wherein a refractive index of the conductive layer is greater than a refractive index of the dielectric fill layer.

14. The method of claim 12, further comprising:

etching back the conductive layer and the dielectric fill layer to form a recess exposing sidewalls of the first isolation structure;

depositing a dielectric layer over the workpiece to fill the recess, wherein the dielectric layer is in direct contact with the first isolation structure; and performing a planarization process to the workpiece.

15. A method, comprising:

receiving a substrate having a first side and a second side opposing the first side;

forming an isolation structure on the first side of the substrate;

etching the substrate to form a trench, the trench exposing a portion of the isolation structure;

depositing a dielectric liner over sidewalls of the trench;

depositing a conductive layer in the trench and in direct contact with the dielectric liner;

depositing a first dielectric fill layer in the trench and in direct contact with the conductive layer, a refractive index of the conductive layer being greater than a refractive index of the first dielectric fill layer;

depositing a second dielectric fill layer over the first dielectric fill layer and in the trench, wherein a composition of the second dielectric fill layer is different than a composition of the first dielectric fill layer;

forming a photodiode in the substrate;

after the forming of the photodiode, performing a planarization process to expose the second side of the substrate; and forming a micro-lens on the second side of the substrate.

16. The method of claim 15, wherein the trench extends through the isolation structure.

17. The method of claim 15, wherein the trench exposes a bottom surface of the isolation structure.

18. The method of claim 15, wherein the depositing of the dielectric liner comprises depositing a first liner and depositing a second liner over the first liner, and wherein a dielectric constant of the first liner is less than a dielectric constant of the second liner.

19. The method of claim 15, further comprising:

before the depositing of the dielectric liner, forming a doped region along sidewalls and bottom surface of the trench.

20. The method of claim 15, wherein the performing of the planarization process further exposes the conductive layer.

* * * * *